US011746062B2

(12) United States Patent
Robinson et al.

(10) Patent No.: US 11,746,062 B2
(45) Date of Patent: Sep. 5, 2023

(54) PROCESSES FOR PREPARING POROUS CERAMICS FOR ACOUSTIC TRANSDUCERS

(71) Applicant: Airmar Technology Corporation, Milford, NH (US)

(72) Inventors: Barry J. Robinson, Hopkinton, MA (US); Brian G. Pazol, Upton, MA (US)

(73) Assignee: AIRMAR TECHNOLOGY CORPORATION, Milford, NH (US)

( * ) Notice: Subject to any disclaimer, the term of this patent is extended or adjusted under 35 U.S.C. 154(b) by 115 days.

(21) Appl. No.: 17/426,998

(22) PCT Filed: Mar. 9, 2021

(86) PCT No.: PCT/US2021/021436
§ 371 (c)(1),
(2) Date: Jul. 29, 2021

(87) PCT Pub. No.: WO2021/188320
PCT Pub. Date: Sep. 23, 2021

(65) Prior Publication Data
US 2022/0041515 A1    Feb. 10, 2022

Related U.S. Application Data

(60) Provisional application No. 62/992,115, filed on Mar. 19, 2020.

(51) Int. Cl.
C04B 35/491    (2006.01)
C04B 35/638    (2006.01)
(Continued)

(52) U.S. Cl.
CPC ........ *C04B 38/0605* (2013.01); *C04B 35/491* (2013.01); *C04B 35/634* (2013.01);
(Continued)

(58) Field of Classification Search
CPC ..... C04B 35/491; C04B 35/497; C04B 35/80; C04B 35/468; C04B 35/47; C04B 35/472;
(Continued)

(56) References Cited

U.S. PATENT DOCUMENTS 2,892,107 A * 6/1959 Williams et al. ....... C04B 35/50
29/25.35
4,777,153 A * 10/1988 Sonuparlak ........... C04B 35/645
264/44
(Continued)

FOREIGN PATENT DOCUMENTS

EP    3 817 077 A1    5/2021
JP    2000119063 A    4/2000
(Continued)

OTHER PUBLICATIONS

Machine translation of JP2000-119063A, 18 pages (Year: 2000).*
(Continued)

*Primary Examiner* — Matthew E. Hoban
*Assistant Examiner* — Lynne Edmondson
(74) *Attorney, Agent, or Firm* — Hamilton, Brook, Smith & Reynolds, P.C.

(57)    ABSTRACT

A process for preparing a porous ceramic body includes forming a green body with a mixture of ceramic material powder, binder material, and pore-forming particles. The process further includes extracting the binder material, decomposing the pore-forming particles, and removing residual organic materials from the green body at respective, progressively higher pre-firing temperatures. After these three stages, the green body is sintered at a still-higher temperature to form the porous ceramic body. Embodiments facilitate manufacturing and can render most or all surface grinding unnecessary, allowing electrode deposition directly onto substantially non-porous surfaces of the porous ceramic
(Continued)

body that are naturally formed during sintering. Advantageously, the green body may be formed into net shape by injection molding the mixture that includes the pore-forming particles, and embodiments can result in porous ceramic bodies that are much thicker than currently available, with better structural integrity.

31 Claims, 10 Drawing Sheets

(51) Int. Cl.
| | |
|---|---|
| C04B 38/06 | (2006.01) |
| H01L 41/18 | (2006.01) |
| C04B 35/634 | (2006.01) |
| H10N 30/097 | (2023.01) |
| H10N 30/853 | (2023.01) |

(52) U.S. Cl.
CPC .......... *C04B 35/638* (2013.01); *C04B 38/067* (2013.01); *H10N 30/097* (2023.02); *H10N 30/8554* (2023.02); *C04B 2235/3249* (2013.01); *C04B 2235/6022* (2013.01)

(58) Field of Classification Search
CPC ............ C04B 35/475; C04B 35/62695; C04B 35/632; C04B 35/634; C04B 35/63424; C04B 35/638; C04B 2235/661; C04B 2235/3249; C04B 2235/3255; C04B 2235/524; C04B 2235/5264; C04B 2235/5436; C04B 2235/6022; C04B 2235/656; C04B 2235/658; C04B 2235/768; C04B 2235/77; C04B 38/067; C04B 38/0605; H01L 41/183; H01L 41/18; H01L 41/1875; H01L 41/1876; H01L 41/43; H01L 41/35; H01L 41/08
See application file for complete search history.

(56) References Cited

U.S. PATENT DOCUMENTS

| | | | | |
|---|---|---|---|---|
| 4,904,291 | A | * | 2/1990 | Siebers ................... C03C 11/00 264/43 |
| 4,963,782 | A | | 10/1990 | Bui et al. |
| 4,970,057 | A | * | 11/1990 | Willkens ............. C01B 21/0682 423/344 |
| 5,112,433 | A | * | 5/1992 | Dawson ................ C04B 35/626 423/594.12 |
| 5,340,510 | A | * | 8/1994 | Bowen .................. H01L 41/333 264/645 |
| 5,434,102 | A | * | 7/1995 | Watanabe ......... H01L 27/11507 427/126.3 |
| 5,598,050 | A | | 1/1997 | Bowen et al. |
| 5,691,960 | A | | 11/1997 | Gentilman et al. |
| 5,834,840 | A | * | 11/1998 | Robbins ............. H01L 21/4807 257/713 |
| 5,841,736 | A | | 11/1998 | Bowen et al. |
| 5,950,291 | A | | 9/1999 | Gentilman et al. |
| 6,107,726 | A | | 8/2000 | Near et al. |
| 6,111,339 | A | | 8/2000 | Ohya et al. |
| 6,111,818 | A | | 8/2000 | Bowen et al. |
| 6,262,517 | B1 | | 7/2001 | Schmidt et al. |
| 6,579,600 | B1 | | 6/2003 | Bowen et al. |
| 6,688,178 | B1 | | 2/2004 | Schmidt et al. |
| 6,806,622 | B1 | | 10/2004 | Schmidt et al. |

FOREIGN PATENT DOCUMENTS

| | | |
|---|---|---|
| JP | 2010093315 A | 4/2010 |
| WO | 2020017478 A1 | 1/2020 |

OTHER PUBLICATIONS

International Search Report and Written Opinion for International Application No. PCT/US2021/021436, entitled "Processes for Preparing Porous Ceramics for Acoustic Transducers," consisting of 14 pages, dated Jun. 16, 2021.

* cited by examiner

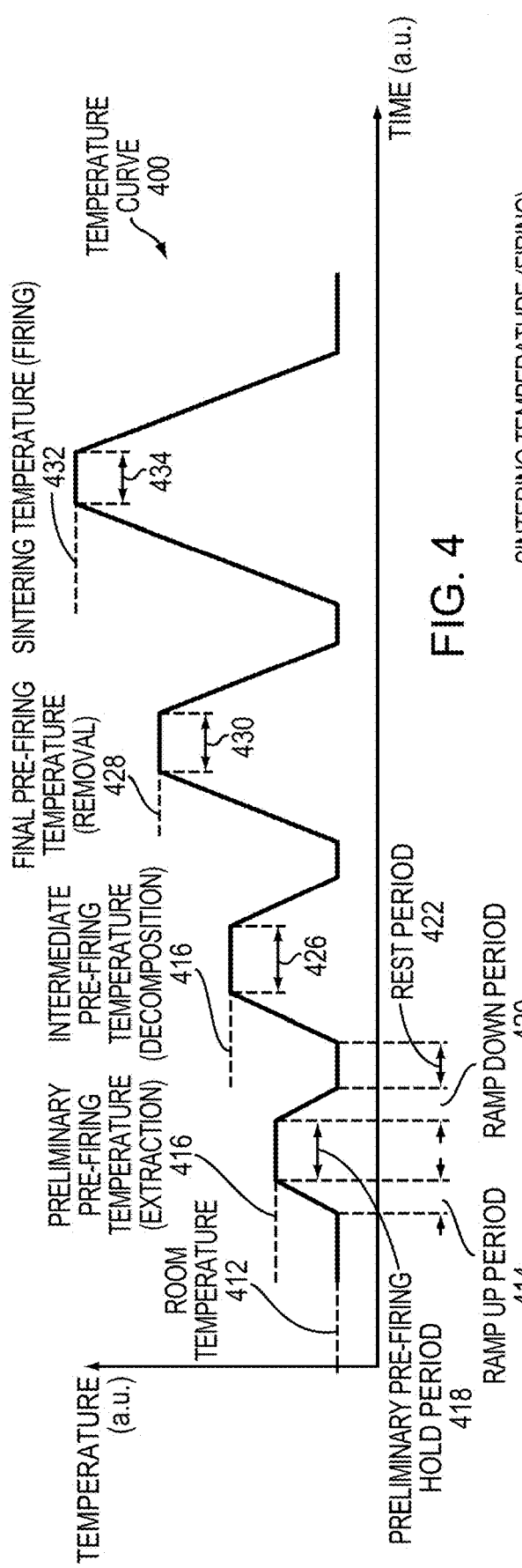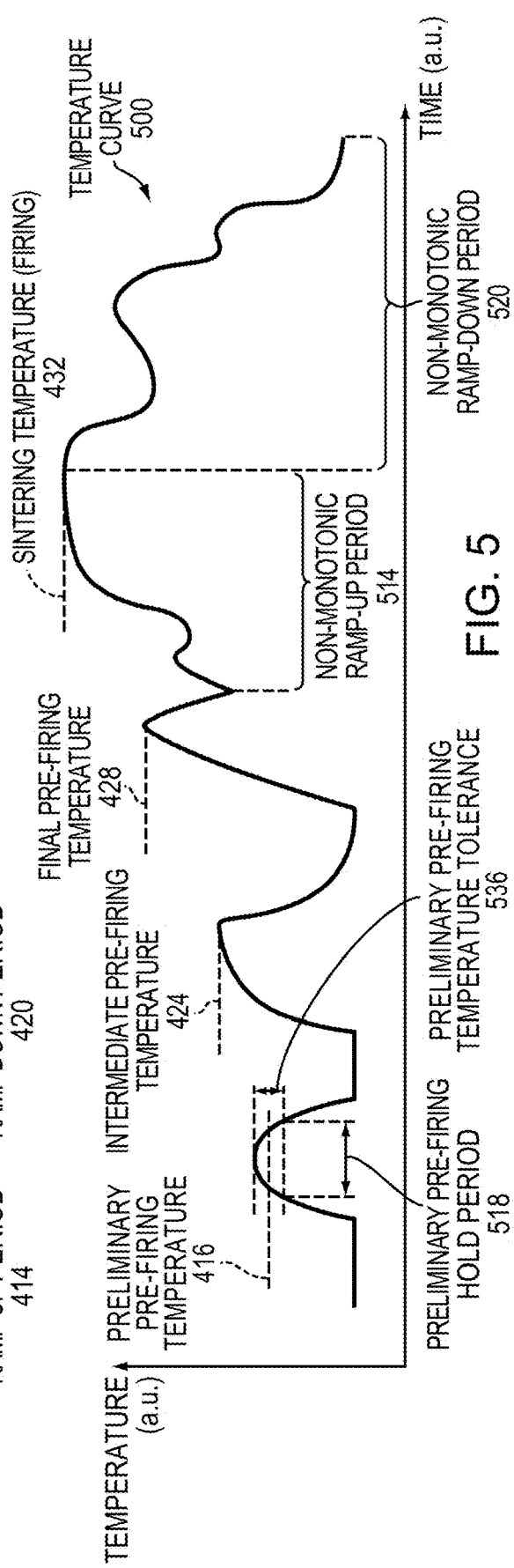

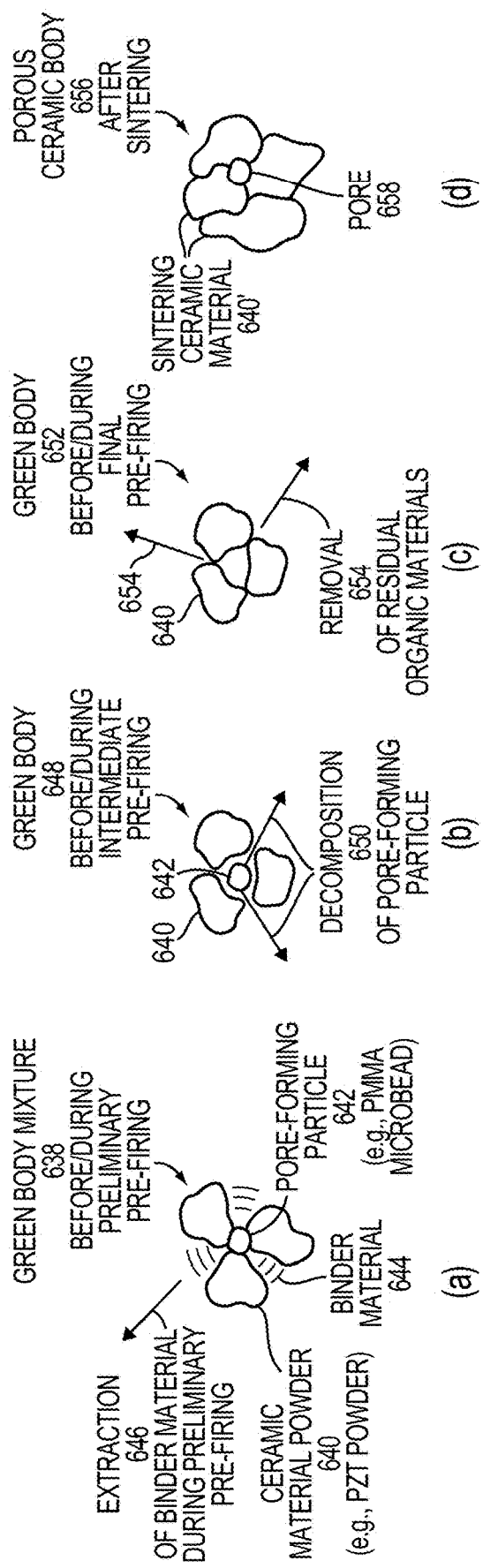
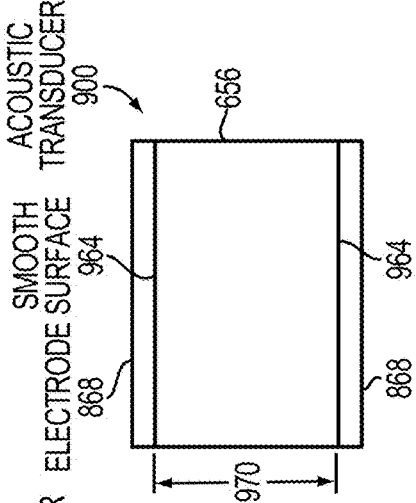
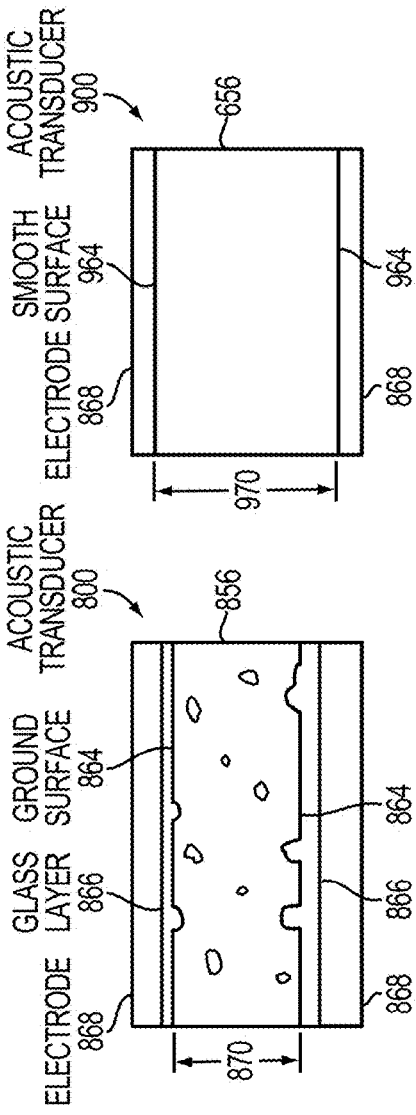
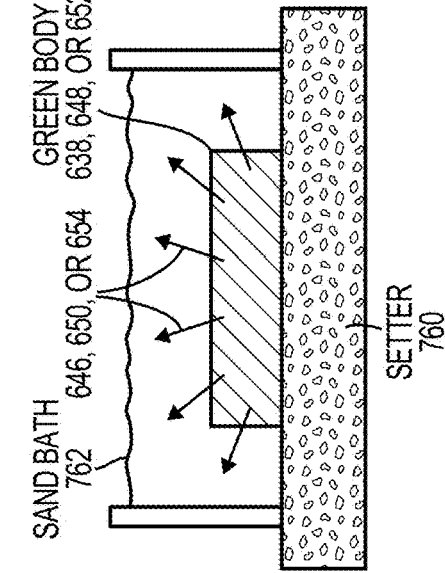

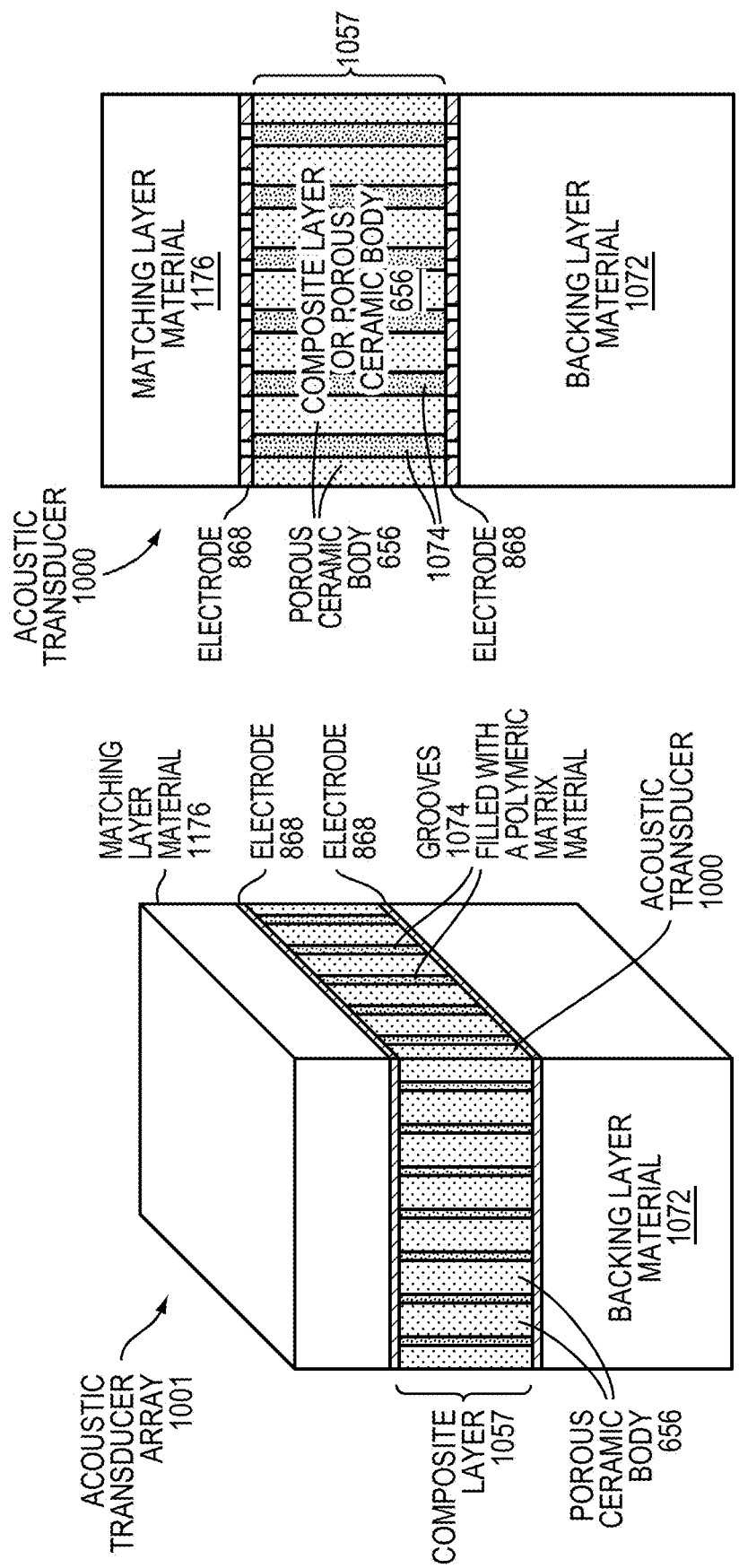

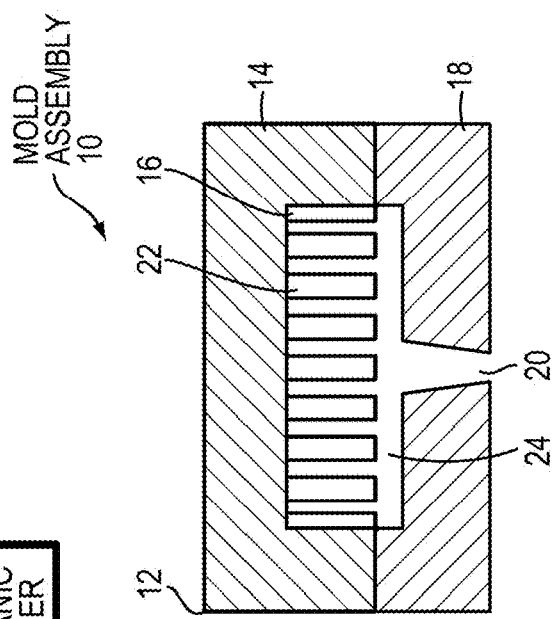
FIG. 13
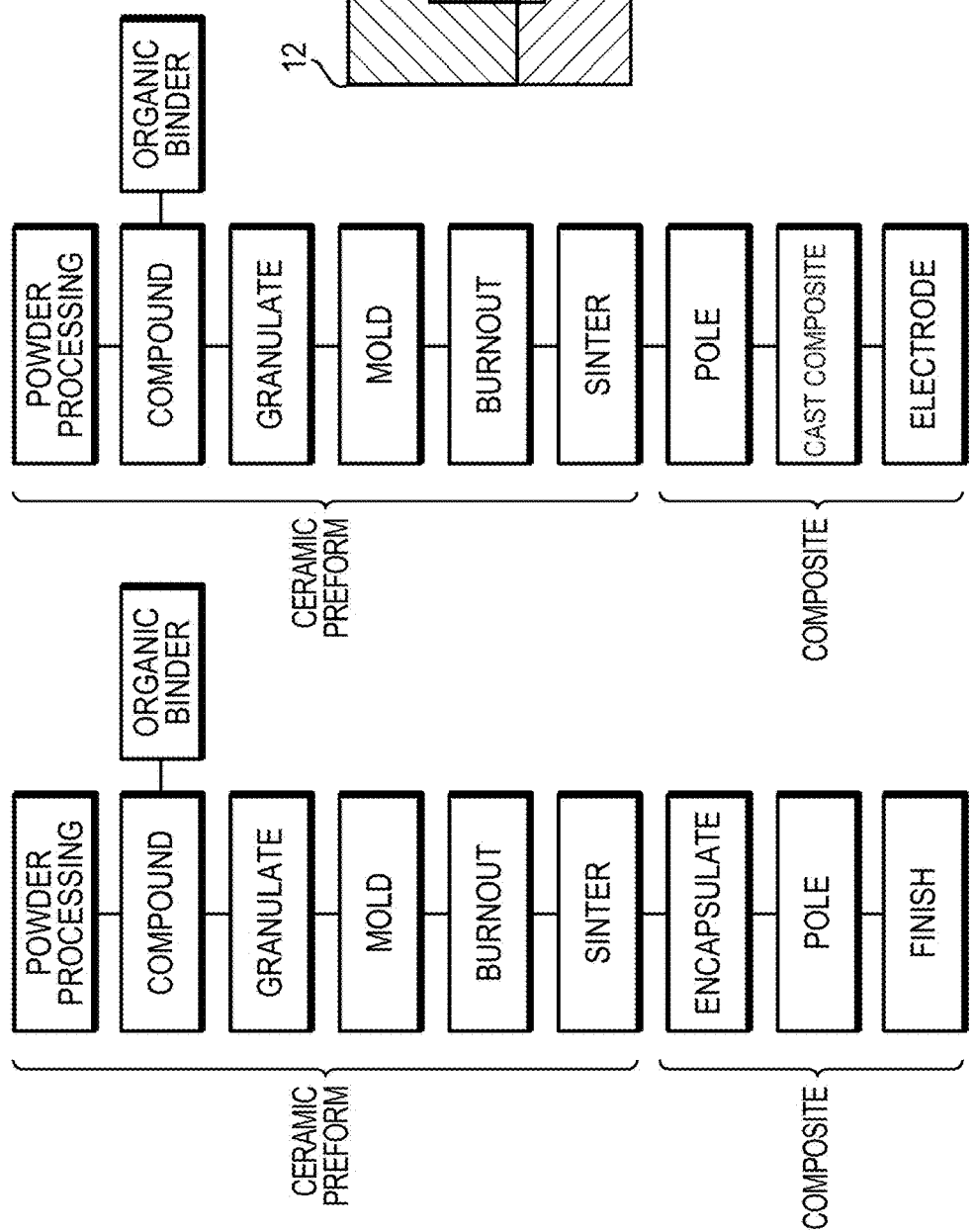
FIG. 12B
FIG. 12A

PROCESSES FOR PREPARING POROUS CERAMICS FOR ACOUSTIC TRANSDUCERS

RELATED APPLICATION

This application is the U.S. National Stage of International Application No. PCT/US2021/021436, filed Mar. 9, 2021, which designates the U.S., and claims the benefit of U.S. Provisional Application No. 62/992,115, filed on Mar. 19, 2020. The entire teachings of the above applications are incorporated herein by reference.

BACKGROUND

Some benefits of piezoelectric or electrostrictive ceramics for acoustic transducers, actuators, flow meters, and other ultrasonic devices are known. Porous ceramics used for these transducers may include a solid compact ceramic body with pores that are uniformly dispersed throughout the solid compact. Porous ceramics can have lower density than non-porous ceramics, providing better acoustic matching to a propagating medium through which the acoustic transducer causes acoustic waves to propagate (water in most cases). Porosity can also improve performance of acoustic transducer ceramics because of the lower acoustic impedance and lower Q that porosity provides.

SUMMARY

Existing techniques for manufacturing porous piezoelectric or electrostrictive ceramic for acoustic transducers are constrained by complicated and laborious manufacturing processes that are limited in terms of the transducer designs and also the quality of products that can be achieved. Pore-forming particles can be introduced into a green body mixture in order to enhance porosity of a ceramic body that is formed after sintering the green body. However, the introduction of pore-forming particles can exacerbate potential structural problems in a sintered ceramic body. These structural problems can include cracking and deformation of the ceramic, which can limit flatness of a ceramic body, for example.

In addition, the structural problems noted above have tended to be worse for relatively thicker ceramic bodies. This is likely one reason why existing porous ceramic bodies made with the aid of pore-forming particles have been limited to about 13 mm in thickness. Furthermore, because of the deformation issue noted above, typical porous ceramic bodies have been ground to their final thickness and flatness after firing (also referred to herein as "sintering") and prior to electroding. Moreover, the firing process naturally leads to formation of a "bark," or relatively smooth, non-porous surface(s) of the sintered ceramic body relative to the much greater porosity in the bulk of the body. For this reason, a smooth, glass surface has typically been applied to the ground surfaces of the sintered ceramic body prior to electroding the surfaces.

The addition of pore formers to an injection molding mixture presents various technical challenges. The added material increases the viscosity of the mixture. The solids loading (amount of ceramic relative to the volume of the mixture) has to be decreased to lower the viscosity. This can decrease the strength of the green preform and also leads to additional shrinkage. The presence of fold lines, cold flow regions, and macroscopic induced stress regions is consistent with injection molding ceramic preforms.

Removing the pore formers after molding requires an additional burn out process at temperatures that are higher than those to remove the organic binder. This added process takes additional time and can add to the risk of cracking and breaking.

Disclosed herein are processes that may be used to overcome the challenges described above. Embodiments provide for processing ceramic material powders mixed with pore-forming particles in a manner that enhances structural integrity of the green body before and during firing to produce a ceramic body and also improves the resulting porous ceramic body in such a way that subsequent processing is facilitated and performance is improved.

Embodiment processes can include an intermediate pre-firing period that has an effect of preserving the ceramic from developing cracks and maintains flatness without grinding sintered surfaces of a ceramic. This carries the significant advantage of obviating a need for application of a glass surface to the ceramic prior to electroding. Electrode materials can, thus, be applied directly to the sintered, substantially non-porous bark surfaces of the porous ceramic body. Furthermore, the additional pre-firing period enables porous ceramic bodies to be formed with significantly greater thickness than existing methods. Moreover, the disclosed processes are compatible with injection molding, facilitating flexible transducer design, greater manufacturing simplicity, and lower cost. In this manner, manufacturing is greatly simplified and product quality is enhanced.

In particular, embodiment processes can include decomposing pore-forming particles (pore formers) in the green body during an intermediate pre-firing period. The intermediate pre-firing period follows a preliminary pre-firing period during which binder material is extracted from the green body, and the intermediate period precedes a final pre-firing period and sintering. The final pre-firing period is particularly characterized by removal of residual organic materials from the green body that has already had the pore-forming particles substantially decomposed therefrom. These staged pre-firing processes preserve the structural integrity and flatness.

The disclosed processes include net-shape processes for fabricating a porous ceramic preform from piezoelectric or electrostrictive materials using injection molding. Disclosed processes can include preparing a homogeneous, granulated, thermoplastic powder/binder mixture from a strongly piezoelectric or electrostrictive ceramic material powder and a thermoplastic organic binder, with sacrificial pore formers also selected and included to be removed from the mixture by heating in a manner that is non-destructive to the ceramic preform.

In various embodiments, the mixture may be injection molded to form a self-supporting green body in a variety of geometries. These include plates, disks, and composite preforms with 1-3 or 2-2 connectivity including a planar ceramic base with parallel ceramic elements extending perpendicularly from the base in a preselected array. Each element may have a rod-like (e.g., 1-3) or lamellar (e.g., 2-2) shape. The green body may be released from the preform mold, heated in successive stages to temperatures between about 70° C. and about 700° C. for respective times sufficient to remove the binder, pore formers, and residual organic materials substantially completely, and then sintered to between 65% and 95% of theoretical density.

Embodiment processes permit transducers to be manufactured from net-shaped disks, plates, rods, hemispheres, wedges, or any other moldable shape. An advantage of injection molding 1-3 or 2-2 structures is a reduction in the amount of ceramic waste generated over conventional dicing or machining of ceramic preforms. In order to fabricate a piezoelectric or electrostrictive composite transducer exhibiting 1-3 or 2-2 connectivity and including a porous piezoelectric or electrostrictive ceramic phase, the sintered, porous ceramic body formed by embodiment processes may be encapsulated in a polymeric material to form a two-phase ceramic/polymer composite. The ceramic base may or may not be removed from the lower planar surface of the composite. The elements may be exposed at each of the upper and lower planar surfaces. The composite may be electroded to establish electrical contact with the elements. The elements may be poled to produce a piezoelectric composite transducer exhibiting 1-3 or 2-2 connectivity, for example. The composite geometry can further enhance performance of the porous ceramic by lowering the acoustic impedance, Q, and by increasing effective coupling and piezoelectric coefficients.

In one embodiment, a process for preparing a porous ceramic body includes forming a green body that is made of a mixture of a ceramic material powder, a binder material, and pore-forming particles. The process also includes extracting the binder material from the green body by heating the green body at a preliminary pre-firing temperature. In addition, the process includes decomposing the pore-forming particles by heating the green body at an intermediate pre-firing temperature that is higher than the preliminary pre-firing temperature. In addition, the process includes removing residual organic materials from the green body by heating the green body at a final pre-firing temperature that is higher than the intermediate pre-firing temperature. The process further includes sintering the green body at a sintering temperature that is higher than the final pre-firing temperature in order to form the porous ceramic body. Advantageously, this process for preparing the porous ceramic body permits the green body to be formed by injection molding the mixture. Further, the injection molding may be to net shape, such that the ceramic body formed upon sintering is in its final net shape, with no post-machining of surfaces of the sintered, porous ceramic body needed. With no post-sintering machining required, manufacturing may be significantly streamlined and facilitated.

In another embodiment, an acoustic transducer is made from a porous ceramic body prepared according to the process described above, or any alternative process described herein.

In a further embodiment, a piezoelectric or electrostrictive acoustic transducer may be prepared by first preparing a porous ceramic body according to the process described above or according to an alternative process within the scope of this specification. This process further includes electroding the sintered, porous ceramic body at opposing surfaces thereof in order to form a piezoelectric or electrostrictive acoustic transducer.

In yet another embodiment, a process for preparing a porous ceramic body includes decomposing pore-forming particles from a green body by heating the green body, wherein the green body has been formed by injection molding a mixture of a ceramic material powder, a binder material, and pore-forming particles. In this process, the binder material has been substantially extracted from the injection-molded green body prior to decomposing the pore-forming particles. This process also includes sintering the green body, following decomposing the pore-forming particles from the green body, in order to form the porous ceramic body.

In still a further embodiment, a process for preparing a porous ceramic body includes injection molding a mixture of a ceramic material powder, a binder material, and pore-forming particles to form a green body. The process further includes extracting the binder material, decomposing the pore-forming particles, and sintering the green body to form the porous ceramic body. Moreover, in another embodiment, an acoustic transducer or transducer array is formed using this process to form the porous ceramic body (or multiple such porous ceramic bodies). The injection molding may be to net shape, such that the ceramic body formed upon sintering is in its final net shape, with no post-machining needed.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 4 is a graph illustrating a temperature curve during an embodiment procedure for preparing a porous ceramic body.

FIG. 5 is a graph illustrating an alternative temperature curve during an embodiment procedure for preparing a porous ceramic body, particularly illustrating flexibility of temperature profiles during embodiment procedures.

FIGS. 6(a)-6(d) are a series of schematic state diagrams representing particles of a green body mixture or porous ceramic body formed therefrom at various processing stages of an embodiment procedure.

FIG. 7 is a cross-sectional illustration of a green body used to produce a porous ceramic body, with the green body being processed using a setter and a sand bath.

FIG. 8 (prior art) is a cross-sectional diagram of an existing acoustic transducer produced by an existing process.

FIG. 9 is a cross-sectional diagram of an embodiment acoustic transducer produced according to an embodiment procedure.

FIG. 10 is a perspective-view diagram illustrating an acoustic transducer array with 1-3 connectivity, which may be produced using embodiment methods.

FIG. 11 is a perspective-view illustration of an acoustic transducer forming one of the acoustic transducer elements illustrated in the array of FIG. 10.

FIG. 12A is a flow chart illustrating additional features in an embodiment process in which poling occurs after encapsulation into a composite.

FIG. 12B is a flow chart illustrating an alternative embodiment process in which the composite process includes poling, followed by casting the composite, followed by electroding.

FIG. 13 is a schematic cross-sectional front view of an example mold that may be used in one embodiment process.

DETAILED DESCRIPTION

A description of example embodiments follows.

Details of Particular Advantageous Embodiments

As noted hereinabove in the Summary section, embodiment procedures described herein permit formation of porous ceramic bodies and transducer arrays with much greater ease and simplicity. The process can be cleaner, less costly, and provide a wider array of design parameters and better performance. In particular, procedures described herein allow formation of a green body via injection molding, where the green body is processed to form a porous ceramic body. The resulting ceramic body can be thicker than about 15 mm, such as between about 15 mm and about 30 mm, for example, and need not have surfaces ground prior to electroding the surfaces.

Figure 1:
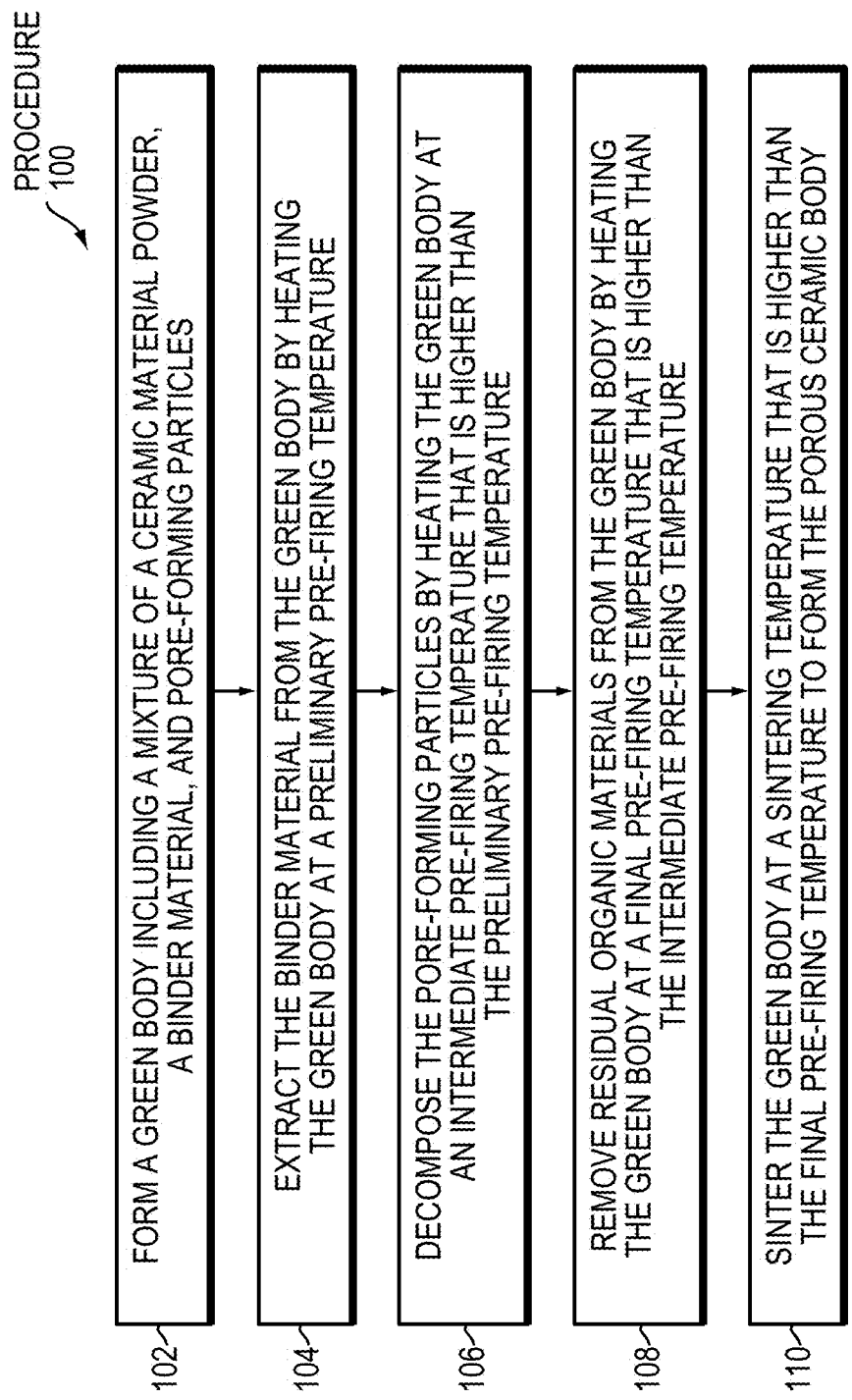
FIG. 1 is a flow diagram illustrating an embodiment procedure for preparing a porous ceramic body.

FIG. 1 is a flow diagram illustrating a procedure 100 that may be used to accomplish the above purposes, particularly in forming a porous ceramic body. At 102, a green body is formed, where the green body includes a mixture of ceramic material powder, a binder material, and pore-forming particles. At 104, the binder material is extracted from the green body by heating the green body at a preliminary pre-firing temperature. At 106, the pore-forming particles are decomposed by heating the green body at an intermediate pre-firing temperature that is higher than the preliminary pre-firing temperature. At 108, residual organic materials are removed from the green body by heating the green body at a final pre-firing temperature. The final pre-firing temperature is higher than the intermediate pre-firing temperature. At 110, the green body is sintered at a sintering temperature that is higher than the final pre-firing temperature, causing the porous ceramic body to be formed.

A significant advantage of the procedure 100 is that it allows the green body, formed from the mixture of the ceramic material powder, the binder material, and the pore-forming particles, to be formed via injection molding. The procedure 100 also provides a process that preserves structural integrity of a porous ceramic body formed thereby, and the procedure 100 can obviate grinding of ceramic surfaces and additional process steps preparatory to electroding. Accordingly, the procedure 100 may be modified to include injection molding the mixture of the ceramic material powder, the binder material, and the pore-forming particles to form the green body.

The porous ceramic body that is formed by the procedure 100 may be a piezoelectric composite body. In various embodiments including the elements of FIG. 1, the ceramic material powder may be at PZT powder, for example. The binder material may advantageously be a wax material, and the pore-forming particles may be PMMA particles, for example. The pore-forming particles may advantageously have an average diameter between about 5 µm and about 15 µm. More particularly, the average diameter of the particles may be between about 7.5 µm and about 12.5 µm. In one preferred embodiment, the pore-forming particles have an average diameter of about 10 µm. In this context of diameters, as used herein, "about" means within one micron. For example, "about 10 µm" means 10±1 µm. If pore-forming particles as described herein are not spherical, or are not perfectly spherical, the diameters noted may be average diameters. As used herein, an "average diameter" may be determined by mathematically averaging measured or otherwise known diameter of a pore-forming particle over rotations of the particle about three mutually orthogonal rotational axes.

In various embodiments, the preliminary pre-firing temperature, the intermediate pre-firing temperature, and the final pre-firing temperature, in addition to the sintering temperature, may have various temperature ranges that are described in connection with FIGS. 4-5, for example. Furthermore, various optional procedure and physical elements described in connection with FIGS. 1-7 and 9-11 and in other parts of the specification may be used to modify the procedure 100 and various porous ceramic bodies and transducers that may be formed thereby.

Figure 2:
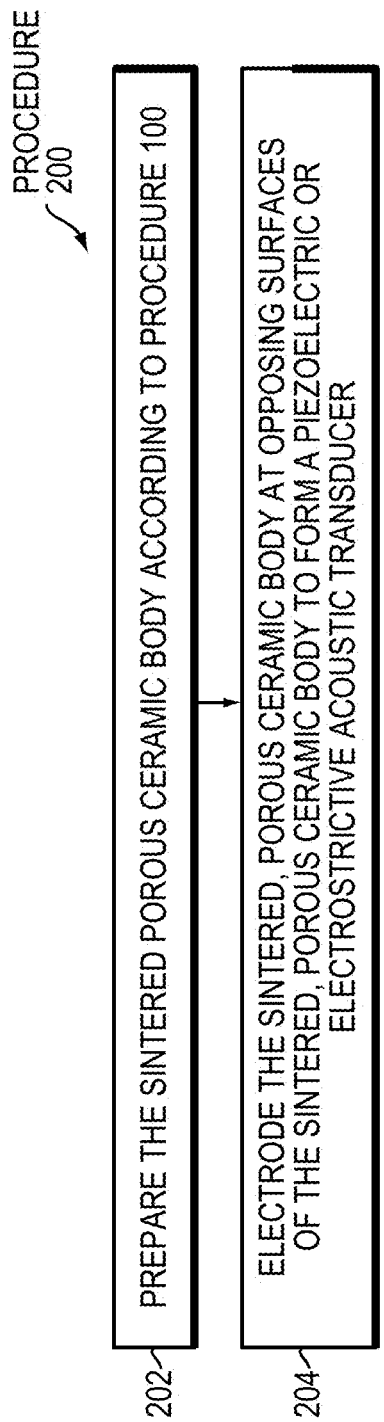
FIG. 2 is a flow diagram illustrating an embodiment procedure for preparing a piezoelectric or electrostrictive acoustic transducer by electroding the porous ceramic body after using the procedure of FIG. 1 for preparing the porous ceramic body.

FIG. 2 is a flow diagram illustrating an embodiment procedure 200 for preparing a piezoelectric or electrostrictive acoustic transducer. At 202, the sintered, porous ceramic body is prepared according to the procedure 100 illustrated in FIG. 1. At 204, the sintered, porous ceramic body is electroded at opposing surfaces thereof to form a piezoelectric or electrostrictive acoustic transducer.

The procedure 200 may be modified to include any elements or features noted in connection with other embodiment procedures, porous ceramic bodies, or acoustic transducer assemblies within the scope of this disclosure. Notably, as described in connection with the procedure 100 of FIG. 1, injection molding may be used to prepare a green body for processing to form the sintered porous ceramic body.

Figure 3:
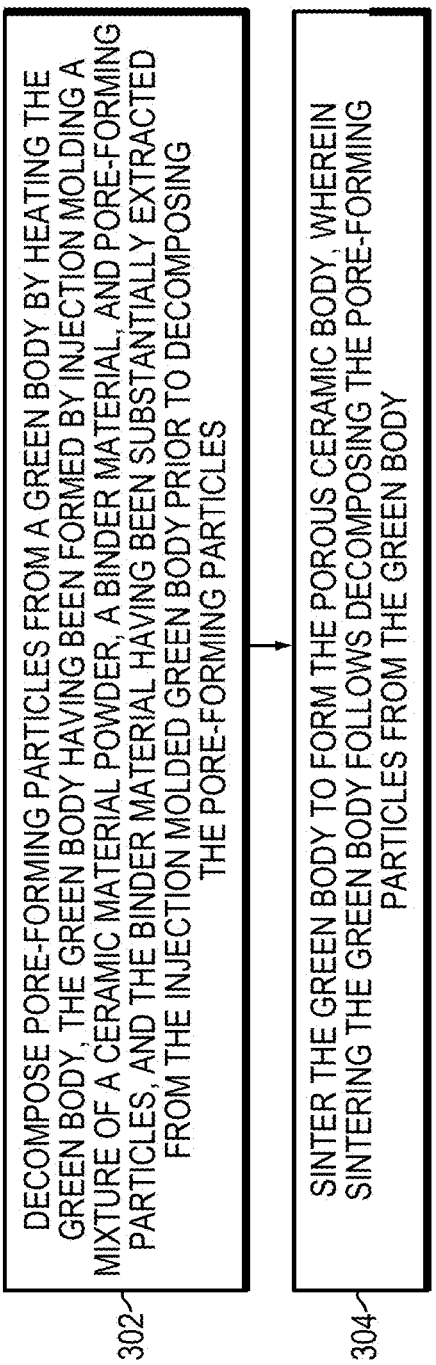
FIG. 3 is a flow diagram illustrating an alternative embodiment procedure for preparing a porous ceramic body including injection molding a mixture of a ceramic material powder.

FIG. 3 is also a flow diagram and illustrates an embodiment procedure 300 for preparing a porous ceramic body. At 302, pore-forming particles from a green body are decomposed by heating the green body, with the green body having been formed by injection molding a mixture of a ceramic material powder, a binder material, and pore-forming particles. At the time the pore-forming particles are decomposed at 302, the binder material already has been substantially extracted from the injection-molded green body. At 304, the green body is sintered to form the porous ceramic body. The sintering at 304 follows the pore-forming particles having been substantially decomposed from the green body.

The procedure 300 may further include any procedural or physical elements described herein in connection with other embodiments. For example, the procedure 300 may be modified to include electroding the porous ceramic body to form an acoustic transducer. Example acoustic transducers that may be formed consistent with this procedure include those illustrated in FIGS. 9-11 and described hereinafter. Also notably, the procedure 300 may be modified to include injection molding the mixture of the ceramic material powder, the binder material, and the pore-forming particles to form the green body.

Furthermore, the procedure 300 may be modified as follows. The decomposing of the pore-forming particles may be performed by heating the green body at an intermediate pre-firing temperature. The sintering may be performed by heating the green body at a sintering temperature that is higher than the intermediate pre-firing temperature. The process may further include removing residual organic materials from the green body, after decomposing and prior to sintering, by heating the green body at a final pre-firing temperature that is higher than the intermediate pre-firing temperature and lower than the sintering temperature.

FIG. 4 is a graph with a temperature curve 400 that illustrates various example temperature stages that are consistent with the procedure 100 of FIG. 1 during transformation of a green body into a porous ceramic body. In particular, the temperature curve 400 shows temperature (in arbitrary units) as a function of time (in arbitrary units). After a green body is formed (e.g., by injection molding), the green body may be at a room temperature 412 illustrated in FIG. 4. During a ramp up period 414, temperature of the green body may be increased to a preliminary pre-firing temperature 416. The preliminary pre-firing temperature 416 may be held for an optional preliminary pre-firing hold period 418.

The preliminary pre-firing hold period 418 is particularly characterized by extraction of the binder material from the green body. This is because the preliminary pre-firing temperature during this period is high enough to extract the binder material (e.g., wax) from the green body (e.g., by melting), even while remaining low enough that the pore-forming particles persist without any significant decomposition thereof. This time period at the preliminary pre-firing temperature is particularly advantageous since the binder material may be removed so as to not interfere with decomposition and removal of the pore-forming particles at a later stage. Removing the binder prior to the decomposition of the pore former leaves a porous structure and provides a path for the decomposed product to escape without causing blisters or cracks. Proceeding in this manner can preserve the structural integrity of the green body, preventing cracking, for example, especially for relatively thicker green bodies.

After the preliminary pre-firing hold period 418, temperature of the green body is decreased over a ramp down period 420, in this case until the temperature reaches the room temperature 412 again. The green body then enters an optional rest period 422, during which the temperature remains at room temperature.

After the rest period 422, the temperature is again ramped up, this time to an intermediate pre-firing temperature 424. This temperature is held for an optional intermediate pre-firing hold period 426. The time period 426 is particularly characterized by decomposition of the pore-forming particles. With the binder material having been previously removed during the preliminary pre-firing, the decomposing pore-forming particles can be extracted from the green body more freely, helping to preserve structural integrity of the green body by avoiding warping and cracking.

After a ramp down to room temperature, as well as an optional hold period at room temperature, the temperature is again ramped up to a final pre-firing temperature 428. This temperature optionally may be held constant for a time period 430, which may be referred to as a final pre-firing hold period. The time period 430 is particularly characterized by removal of residual organic materials from the green body. With the binder material and the pore-forming particles having been previously removed and decomposed, respectively, the residual organic materials can be extracted from the green body more freely during this period. The final pre-firing temperature 428 is high enough for effective, substantial removal of residual organic materials from the green body, but is not high enough to sinter the green body substantially. In this manner, the green body can remain free from residual organic materials.

After a ramp down from the final pre-firing temperature 428, the temperature then optionally may be held at room temperature for a rest period and then ramped up to a sintering temperature 432. The green body may be optionally held at the sintering temperature 432 for a sintering hold period 434 before the temperature is ramped down once again.

While the temperature curve 400 in FIG. 4 is consistent with the procedure 100 in FIG. 1, as well as with the procedures 200 and 300 in FIGS. 2 and 3, respectively, it should be understood that the temperature curve 400 is exemplary. Thus, in other examples, there may be multiple preliminary, intermediate, and final pre-firing periods or multiple sintering periods, optionally separated by ramp down or rest periods. Furthermore, the ramp up and ramp down periods need not be linear. The preliminary, intermediate, and final pre-firing hold periods and the sintering hold period need not be characterized by strictly constant temperatures. Temperature may increase and decrease other than monotonically during ramp up and ramp down periods, respectively. Furthermore, the room temperature 412 need not be reached after every stage. Certain of these parameter flexibilities are described hereinafter in connection with FIG. 5.

FIG. 5 is a graph illustrating an exemplary temperature curve 500 that is consistent with the procedures 100, 200, and 300 in FIGS. 1, 2 and 3, respectively. As an example of the flexibility described in connection with FIG. 4, the temperature curve 500 shows that the preliminary pre-firing temperature 416 is maintained for a preliminary pre-firing hold period 518 only within a preliminary pre-firing temperature tolerance 536. The temperature tolerance 536 may be +/−3° C., +/−5° C., +/−10° C., +/−15° C., +/−25° C., or +/−50° C., with respect to the preliminary pre-firing temperature 416, for example, in various specific embodiment procedures. Similarly, the intermediate pre-firing temperature 424, final pre-firing temperature 428, and sintering temperature 432 may be maintained only within particular tolerances, such as the example tolerances noted in connection with the preliminary pre-firing temperature 416.

As such, it should be understood that extracting the binder material from the green body by heating the green body "at the preliminary pre-firing temperature," as used herein, broadly denotes that the preliminary pre-firing temperature 416 is maintained to within a tolerance of a nominal temperature value throughout a hold period, with the actual temperature during the preliminary pre-firing hold period always remaining below the intermediate pre-firing temperature 424 and any lower tolerance thereof. Similarly, decomposing the pore-forming particles by heating the green body "at the intermediate pre-firing temperature that is higher than the preliminary pre-firing temperature," as used herein, denotes that the actual temperature is held to within a tolerance of the nominal intermediate pre-firing temperature 424 for the intermediate pre-firing hold period 426. The actual temperature during the hold period 426 always remains above the preliminary pre-firing temperature and any upper tolerance thereof, and below the final pre-firing temperature 428 and any lower tolerance thereof.

Similarly, removing the residual organic materials from the green body by heating the green body "at the final pre-firing temperature that is higher than the intermediate pre-firing temperature," as used herein, denotes that the temperature is held to within a tolerance of the nominal final pre-firing temperature 428 for the final pre-firing hold period 430, with the actual temperature during this time remaining above the intermediate pre-firing temperature 424 and any upper tolerance thereof. Moreover, similarly, sintering the green body "at the sintering temperature that is higher than the final pre-firing temperature," as used herein, denotes that the temperature remains at the sintering temperature 432, within a tolerance, and above the final pre-firing temperature 428 and any upper tolerance thereof during the sintering hold period 434.

The temperature curve 500 also illustrates that at the second stage, intermediate pre-firing, the ramp up period to the intermediate pre-firing temperature 424 is not linear. Similarly, the ramp down from the intermediate pre-firing temperature 424 is not linear. The temperature curve 500 also illustrates that after the final pre-firing temperature 428, during the final pre-firing temperature stage, the temperature is ramped down, not to the room temperature 412, but to a temperature that is between room temperature and the final pre-firing temperature 428.

The temperature curve 500 further illustrates that, during a non-monotonic ramp up period 514, temperature is increased to the sintering temperature 432. After reaching the sintering temperature 432, the temperature is ramped down, during a non-monotonic ramp down period 520, back to room temperature. The non-monotonic ramp up period 514 includes a dip, and may generally include any number of dips in temperature. Similarly, the non-monotonic ramp down period 520 includes two localized temperature rises during the descent from the sintering temperature 432, which can be deliberate process enhancements, or which can be features reflecting specific heating equipment or process features that are inconsequential to the processes described herein for forming a porous ceramic body. In other embodiments, there can be local increases in temperature during sintering or pre-firing periods, for example, wherein the temperature reaches a higher value than a nominal pre-firing or sintering temperature.

In some embodiments, the preliminary pre-firing temperature 416, particularly characterized by extraction of the binder material, may be between 70° C. and 390° C. More preferably, the preliminary pre-firing temperature 416 may be between 290° C. and 390° C. In some embodiments, the preliminary pre-firing temperature 416 may be between 310° C. and 370° C., with a nominal value of 340° C. In some embodiments, the intermediate pre-firing temperature 424, characterized by decomposition of the pore-forming particles, may be between 450° C. and 550° C., for example. More particularly, in certain embodiments, the intermediate pre-firing temperature 424 is between 475° C. and 525° C., with a nominal value of 500° C.

In certain embodiments, the final pre-firing temperature 428, particularly characterized by removal of residual organic materials from the green body, may be between 600° C. and 800° C. In certain embodiments, the final pre-firing temperature may be between 675° C. and 725° C., with a nominal value of 700° C., for example. As with the preliminary, intermediate, and final pre-firing temperatures, the sintering temperature can depend upon the specific composition of the green body, including the specific ceramic material powder that is used. These temperature values can also depend upon size and shape of the green body. In certain embodiments, the sintering temperature may be between 1025° C. and 1485° C. In other more particular embodiments, the sintering temperature 432 is between 1225° C. and 1285° C., with a nominal sintering temperature of 1255° C., for example.

Further flexibilities in pre-firing temperature profiles that may be applied in various embodiment processes are described in connection with FIGS. 18-21.

FIGS. 6(a)-6(d) are a series of schematic state diagrams representing particles of a green body mixture or porous ceramic body formed therefrom at various processing stages of an embodiment procedure. FIG. 6(a) depicts a green body mixture 638 before and during preliminary pre-firing. The green body mixture 638 is a mixture of ceramic material powder 640 (e.g., PZT powder), pore-forming particles 642 (e.g., PMMA microbeads), and a binder material 644 (e.g., a wax). The binder material 644 allows the mixture to be held together in a preform after injection molding, for example. A mold used for the injection molding process may then be removed, and the green body mixture can remain intact, in a form desirable for further processing. As temperature is raised to the preliminary pre-firing temperature, the binder material 644 begins to be extracted, as illustrated at the arrow 646.

FIG. 6(b) illustrates the green body (designated green body 648 at this stage) before and during the intermediate pre-firing period 426 illustrated in FIG. 4. During the intermediate pre-firing period, the ceramic material powder particles 640 continue to remain largely intact and unmodified, while the pore-forming particles 642 decompose as the green body 648 is heated to the intermediate pre-firing temperature and held for a holding period, as illustrated by decomposition arrows 650. It is desired that the decomposed pore-forming particles (water and $CO_2$) leave the matrix. Fresh air may be circulated through the oven to aid this process. While the decomposed pore-forming particles may contribute to the residual organic material that may be removed during the final pre-firing stage, it is preferable for the decomposed pore-forming particles to be removed in a substantially complete manner during the intermediate pre-firing stage. The circulated, flowing air can advantageously aid in this process.

FIG. 6(c) illustrates the green body (designated green body 652 at this stage), before and during the final pre-firing stage 430 illustrated in FIG. 4. During this time, the ceramic material powder particles 640 still remain largely unmodified, but residual organic materials are further extracted from the green body 652, as illustrated by arrows 654.

FIG. 6(d) illustrates particles of a porous ceramic body 656 formed from the green body 652 after the sintering period 434 illustrated in FIG. 4. An example pore 658 in the porous ceramic body 656 remains in place of the pore-forming particle 642, while the ceramic material powder 640 has been transformed into particles 640' of sintered ceramic material that have been largely compacted together, even while pores 658 still remain.

FIG. 7 is a cross-sectional schematic diagram of the green body 638, 648, or 652 at the respective stages of processing illustrated in the procedure 100 of FIG. 1, the temperature curve 400 of FIG. 4, and the schematic state diagrams of FIGS. 6(a)-6(d). FIG. 7 shows the green body 638, 648, or 652 optionally placed on a setter 760. In some embodiment processes, extracting the binder material, decomposing the pore-forming particles, or removing the residual organic materials, which are illustrated in FIGS. 6(a), 6(b), and 6(c), respectively, may include placing the green body on the setter 760. In some embodiments, the green body may be placed on an $Al_2O_3$ setter for sintering (i.e., the setter 760 may be an $Al_2O_3$ setter).

A sand bath 762 is also illustrated in FIG. 7, which may assist in extraction 646 of the binder material, decomposition 650 of the pore-forming particles, or removal 652 of residual organic materials from the green body 638, 648, or 652, respectively. The green body can be immersed in the sand bath for any of these heating/processing stages. The sand bath can include stabilized zirconia or zircon ($ZrSiO_4$) sand, for example, or other suitable materials that will be apparent to those of skill in the art in view of this description.

FIG. 8 (prior art) is a cross-sectional diagram of a prior art acoustic transducer 800. The transducer 800 is formed from a porous ceramic body 856 that is not prepared by injection molding nor in accordance with the procedures 100, 200, or 300 of FIG. 1, 2, or 3, respectively. Because of this, the ceramic body 856 is limited in a thickness 870 thereof, such as limited to about 13 mm in thickness. Furthermore, the ceramic body 856 is ground to final thickness 870 at surfaces 864 at top and bottom. The ground surfaces 1864 are porous at least after this surface grinding, so glass layers 866 are applied to the ground surfaces for smoothness prior to electroding the transducer with electrode layers 868.

Glass layers may be applied by screen printing, pad printing, or painting a glass material suspended in an organic matrix. The organic material may be burned away and the glass brought to a temperature above its softening point to allow it to flow and coat the surface. FIG. 9, in contrast to FIG. 8, illustrates an acoustic transducer 900 that is prepared consistent with the procedures 100, 200, and 300 of FIGS. 1, 2, and 3, respectively. The acoustic transducer 900 includes the porous ceramic body 656, after sintering, which is prepared according to the process illustrated in FIGS. 6(a)-6(d). Because of the multi-stage process including extraction, decomposition, and removal of organic residual organic materials, followed by sintering, at the respective temperatures, a thickness 970 of the porous ceramic body 656 formed consistent with embodiments can be much greater than the thickness 870 of the prior art porous ceramic body 856 of FIG. 8.

Furthermore, as a natural byproduct of the firing process (sintering) of the green body 652 to form the porous ceramic body 656, the green body 652 of FIG. 6(c) develops substantially smooth, substantially non-porous, opposing top and bottom surfaces 964 as it is transformed into the porous ceramic body 656 of FIGS. 6(d) and 9 during sintering. As used herein, "substantially non-porous" means a surface without spaces or holes larger than 1 micron in diameter which liquid or gas may pass. These smooth surfaces 964 may be referred to herein as a "bark" that forms because of the sintering process. Because no grinding of the smooth surfaces 964 is required when the porous ceramic body 656 is formed accordingly the procedures described in relation to FIGS. 1-6, the electrodes 868 may be applied directly to the smooth surfaces 964 at top and bottom of the acoustic transducer 900 without application of the glass layer 866 shown in FIG. 8. This results in a cleaner and simpler production process. Forming methods such as pressing do not produce parts with precise uniform thicknesses, such as injection molding produces. Workpieces formed by forming methods such as pressing need to be ground flat and to final thickness.

In some embodiments, the thickness 970 of the porous ceramic body 656 is at least about 15 mm after being prepared according to the process of FIGS. 6(a)-6(d). In other embodiments, the thickness is at least about 20 mm after the sintering process. In the context of ceramic body thickness, as used herein, "about" means a tolerance of +/−1 mm in thickness. Thus, for example, "about 20 mm" means 20±1 mm. In some embodiments, the thickness is between about 15 mm and about 40 mm. In other embodiments, the thickness is between about 15 mm and about 30 mm. In yet other embodiments, the thickness is between about 20 mm and about 30 mm. It should be understood that the acoustic transducer 900 may be a piezoelectric or an electrostrictive acoustic transducer. The processes described in connection with FIGS. 1-7 are compatible with both types of acoustic transducers. The piezoelectric or an electrostrictive nature may be selected by including an appropriate ceramic material powder in forming the green body mixture, as will be understood by those of skill in the art in view of this description.

FIG. 10 is a perspective-view diagram of an acoustic transducer array 1001 that is prepared consistent with the procedure 200 of FIG. 2. The acoustic transducer 1001 exhibits 1-3 piezocomposite connectivity. In addition, a piezoelectric or electrostrictive acoustic transducer exhibiting a 2-2 piezoelectric composite connectivity, or a different known connectivity, may be produced using disclosed processes. The processes described herein are particularly advantageous when used for complex transducer arrays, such as the array 1001. In the prior art, grooves 1074 had to be machined (i.e., ground) into a ceramic block. However, consistent with embodiment procedures, the porous ceramic body 656 of the acoustic transducer array 1001 may be formed of a green body mixture comprising ceramic material powder, pore-forming particles, and a binder material, the mixture injection molded to form a green body that may be further processed according to embodiment methods described hereinabove. This process greatly facilitates production of transducer arrays such as the array 1001.

The acoustic transducer array 1001 further includes a backing layer material 1072. Interspersed between the grooves 1074, and extending from the backing material 1072, lie individual acoustic transducers 1000, with the entire array of acoustic transducers 1000 having been formed using the injection molding process. The grooves 1074 are also referred to herein as "trenches." The grooves 1074 may also be referred to as "voids" or "void spaces" prior to being filled with a polymeric matrix material or other matrix material to form a composite layer 1057. The backing layer material 1072 may be coupled directly or indirectly to the electroded transducers 1000. In the case of indirect coupling, there may be one or more layers of other material(s) disposed between the electrode layer and the backing, for example.

FIG. 11 is a cross-sectional-view illustration of a single acoustic transducer 1000 from the array 1001 in FIG. 10. As illustrated in FIG. 11, the acoustic transducer 1000 includes, in addition to the backing layer material 1072, one or more matching layers 1176. The one or more matching layer(s) 1176 may be applied directly or indirectly to the electrode layer 868 after the porous ceramic body 656 is electroded. In case of indirect application, one or more layers of other material(s) may be disposed between the matching layer and the electrode layer. It should be understood that the acoustic transducer 1000, or the array 1001 in FIG. 10, may be encapsulated in polymeric material, according to methods that are known in the art. The encapsulating, polymeric material thus forms insulating and protective barriers between the acoustic transducers 1000 and the environment.

It should be further understood that, where the transducer or array comprises a piezoelectric ceramic body, embodiment procedures may further include poling the sintered, porous ceramic body by applying an electric field, as will be understood by those of skill in the art in view of this description. With appropriate formation of an acoustic transducer array, such as the array 1001, the electroding of the porous ceramic body 656 may result in piezocomposite connectivities such as 1-3 or 2-2 connectivities, for example.

Further Details Applicable to Certain Embodiments

Electromechanical transducers are used for the interconversion of electrical and mechanical energy in acoustic applications. These applications include, but are not limited to, resonators, acoustic signal detectors, acoustic projectors, non-destructive testing, and ultrasonic imaging. Typically, the acoustically active element in such transducers is made from a piezoelectric ceramic material such as lead zirconate titanate (PZT), lead magnesium niobate (PMN), or similar strongly piezoelectric material. (See, e.g., B. Jaffe et al., Piezoelectric Ceramics, Academic Press, London, N.Y., 1971, particularly Chs. 5, 7, and 8.)

In some applications, composites of piezoelectric ceramic fibers or sheets in a polymer or plastic matrix are more effective transducers than solid ceramic material. Many such piezoelectric ceramic/polymer combinations have been described in the literature, and some have found commercial application. In particular, fine-scale piezoelectric ceramic fibers or strips separated by an organic polymer phase are used in medical ultrasound and acoustic nondestructive evaluation. Other applications include hydrophones, which are lightweight large area actuators for use in a water environment, where the composite allows improved acoustic coupling to water or body fluids compared with solid ceramic transducers. (R. E. Newnham et al., "Composite Piezoelectric Transducers," Materials in Engineering 2, 93-106 (December 1980); J. A. Hossack et al., "Finite Element Analysis of 1-3 Composite Transducers", IEEE Transactions on Ultrasonics, Ferroelectrics, and Frequency Control 38 [6]618-629 (November 1991). Newnham et al. is incorporated herein by reference.)

Many composite configurations have been constructed and evaluated on a laboratory scale. One successful combination has a one-dimensionally connected ceramic phase (e.g., PZT fibers) contained within a three-dimensionally-connected matrix provided by an organic polymer phase. This combination is known in the art as a 1-3 composite. (Newnham et al., supra, p. 95.) Hydrophone figures of merit (Newnham et al., supra, p. 93.) for this composite can be made over 10,000 times greater than those of solid PZT ceramic by appropriately selecting the phase characteristics and composite structure. Another important configuration includes two dimensionally-connected strips of PZT ceramic separated by two-dimensionally-connected parallel strips of polymer, designated a 2-2 composite. (Newnham et al., supra, p. 95.). This configuration has been widely used in phased-array-type transducers.

For high frequency applications, for example ultrasonic imaging, the piezoelectric ceramic elements in the composite must have extremely small dimensions (for example 20-200 µm diameter) for sufficiently high frequencies to be attained. The fineness of these composite array elements makes composite manufacturing extremely difficult.

Early composites were fabricated by hand-aligning extruded PZT ceramic rods in a jig and encapsulating in epoxy resin, followed by slicing to the appropriate thickness and poling of the ceramic rods. (Newnham et al., supra, pp. 98-99.) This approach demonstrated the performance advantages of this material, but also highlighted the difficulties involved in fabricating 1-3 composites on a large scale, even for prototype purposes. These difficulties include: (1) the requirement to align and support large numbers of PZT fibers during encapsulation by the polymer, and (2) the high incidence of dielectric breakdown during poling arising from the significant probability of encountering one or more defective fibers in a typical large array.

Several attempts have been made to demonstrate more viable manufacturing processes. A procedure has been developed for assembling composites from extruded PZT fibers using automated fiber placing and assembly. This approach is effective for coarse composites having fibers of approximately 0.5-1 mm diameter, which are strong enough to be machine-handled. For finer-scale composites, a typical practice is to dice the ceramic composite structure from solid ceramic using a wafer-dicing saw. In this case, a portion of the solid ceramic piece is left intact as a support for the PZT fiber array. (Hossack et al., supra, pp. 621-625.) While this technique can be used to fabricate fine structures having ceramic elements under 50 µm across, the process yield becomes lower as the element dimensions are reduced, due to the presence of defects in the ceramic or limitations in the capability of the sawing process itself. In addition, this process does not readily allow the fabrication of ceramic elements which have special shapes since the sawing process is limited to straight cuts.

Later, attempts to fabricate such composite transducers by a net shape slip casting process were reported. (U. Bast et al., "A new Technique for the Production of Piezoelectric Composites with 1-3 Connectivity," Ceramics Today—Tomorrow's Ceramics, Proc. 7th CIMTEC—World Ceramics Congress, Terme, Italy, Jun. 24-30, 1990, published in Materials Science Monographs, 66C, P. Vincenzini, Ed. Elsevier Science Press, N.Y., 1991.) In this slip casting process, a disposable plastic tool containing holes is fabricated for use as a template or support for forming a liquid slurry of PZT powder into the desired preform shape. "Preforms" are also referred to herein as "green bodies." During the ceramic firing process, the plastic tool is burned away, leaving a porous PZT fiber array which is then sintered to achieve a dense product. However, this process has the disadvantage that it requires a new plastic tool for each ceramic part that is fabricated, leading to high tooling cost.

A net-shape process for fabricating a fully dense ceramic preform (also referred to herein as a "ceramic body") for a piezoelectric or electrostrictive composite transducer exhibiting 1-3 or 2-2 connectivity was later developed. This net-shape process involves preparing a homogeneous, granulated, thermoplastic powder/binder mixture including a ceramic powder selected from the strongly piezoelectric or electrostrictive ceramic materials and sufficient thermoplastic organic binder to render the mixture moldable by injection molding. The binder may be selected to render the mixture thermoplastic during injection molding at that solids loading and to be nondestructively removed from the mixture by heating. A green body of the preform may be formed by injection molding the mixture in an injection molding apparatus including a preform mold, which is a negative of the preform green body, and cooling the green body in the preform mold sufficiently to be releasable from the preform mold as a self-supporting green body.

The green body may include a planar base and a plurality of parallel elements that are integral with and extend perpendicularly from the base in a preselected array and fixedly supported in the array by the base. The planar base and plurality of parallel elements are comprised of the mixture of ceramic powder and of the binder material. Each element has a rod-like or lamellar shape. The self-supporting green body is released from the preform mold, and is heated to a temperature of 300°–700° C. for a time sufficient to completely remove the binder from the green body. The binder-removed body may be sintered at a temperature and for a time sufficient to densify the body to at least about 95% of theoretical density to produce a fully dense preform.

In other aspects, the fully dense preform may be used to fabricate a piezoelectric or electrostrictive composite transducer exhibiting 1-3 or 2-2 connectivity and including a fully dense piezoelectric or electrostrictive ceramic phase. The process can further involve encapsulating the fully dense elements of the preform in a polymeric material to form a two-phase ceramic/polymer composite having upper and lower planar surfaces. The lower planar surface can include the ceramic base. The ceramic base can be removed from the lower planar surface, and the fully dense elements can be exposed at each of the upper and lower planar surfaces. The composite can be electroded at the upper and lower surfaces such that electrodes establish electrical contact with opposing surfaces of each of the fully dense elements. In a narrower aspect, the fully dense elements may be poled in a high electric field at a temperature just below the Curie temperature of the ceramic material for a time sufficient to produce a piezoelectric composite transducer exhibiting 1-3 or 2-2 connectivity.

In one aspect applicable to some embodiments, a ceramic fiber or strip (lamellar) preform (for a 1-3 or 2-2 composite, respectively) can be fabricated by injection molding a near net-shape body utilizing reusable tooling. After binder removal, the body may be sintered to produce the desired net shape preform. To produce a piezoelectric or electrostrictive piezocomposite, the preform is then filled in a polymer matrix and machined to remove excess material and the base. Electrodes are then applied in known manner. Poling of the ceramic phase may be performed in known manner to produce a piezoelectric transducer.

In this exemplary process, injection molding is used as the means to form the PZT powder into the composite preform shape. Injection molding has been widely used in the plastics industry as a means for rapid mass production of complex shapes at low cost. The fabrication of ceramics using injection molding technology was developed later, and it has been most successful for shapes, e.g. thread guides, of small cross-section and for large, complex shapes that do not require sintering to high density, e.g. turbine blade casting inserts.

In application to some of the disclosed processes, a hot thermoplastic mixture of a PZT ceramic powder and organic binder may be injected under pressure into a cooled mold, permitting fabrication of complex shapes with the ease and rapidity normally associated with plastics molding. The PZT powder typically, but not necessarily, may be doped with a fraction of a percent of a donor or acceptor component to enhance its piezoelectric properties or to tailor its properties to suit the intended application. Typical dopants include iron, niobium, lanthanum, and other rare earth elements. The powder is typically added to the mixture at a high solids loading, e.g., >50 volume %. The organic binder is removed from the molded bodies nondestructively by slow binder removal over a period of approximately 10-100 hours. Nondestructive binder removal is aided by a high solids loading in the injection molded mixture. Once the binder is removed, the subsequent firing, poling, and polymer encapsulation processes are similar to those used for conventional PZT/polymer composites.

One process for fabricating such a PZT ceramic preform uses shaped tool inserts to allow changes in part design without incurring excessive retooling costs. The elements are molded on an integral ceramic base, which can be removed after the sintering and polymer encapsulation process steps have been completed. If needed, individual preforms can be configured together (i.e., the bases can be machined and butted edge to edge to form larger arrays of PZT fibers or strips).

FIG. 12A is a flow chart illustrating the process. The PZT powder may be milled if desired to achieve a desired grain size and distribution. The powder is then homogeneously mixed in a solids loading of at least about 50% by volume in a heated mixer with a thermoplastic organic binder. The mixer should be heated to at least the melting point of the binder. The binder is selected to provide with the powder a hot thermoplastic mixture suitable for injection molding, and to be removed by slow heating with no residue deleterious to the fabrication process. Examples of suitable binders (also referred to herein as "binder materials") include waxes such as paraffin wax, polypropylene, and polyethylene. The mixture may be cooled and granulated before molding. The granulated mixture may be injection molded using conventional apparatus fitted with a specifically designed mold. Typically, injection molding pressure is about 50-20,000 psi. Preferably, all surfaces contacting the hot mixture are selected to be non-reactive therewith.

FIG. 12B is a flow chart illustrating an alternative embodiment process in which the composite process includes poling, followed by casting the composite, followed by electroding. FIG. 12B is in contrast to FIG. 12A, in which poling occurs after encapsulation into a composite.

FIG. 13 is a schematic illustration of an exemplary mold assembly 10. A tool body 12 includes cavity a portion 14 enclosing a cavity 16. The tool body 12 also includes a sprue portion 18, through which a sprue 20 permits filling of the cavity 16 during the injection molding process. Removably positioned within the cavity 16 is a replaceable insert 22, which, with the cavity 16, defines a mold 24. The mold 24 is a negative of the desired preform, described hereinafter. Conveniently, the insert 22 may be one of a set of interchangeable inserts (not shown) of different shapes for assembling with the cavity 16 to provide molds of different designs.

The mixture may be heated sufficiently by the injection molding process to remelt the binder, allowing the mixture to completely fill the cavity 16 and to conform to the mold 24. The mold 24 is sufficiently cool to produce a shape-retaining green body having a shape near to, but slightly larger than, the shape of the preform. A typical preform size is about 50×50 mm. Normally, a small amount of molding shrinkage is expected. In some cases, the size of the preform can be limited to minimize the possibility of shearing off the outermost elements during the cooling portion of the molding cycle. Any such size limitation may be determined empirically. Fabrication of larger transducers is described hereinafter. Of course, the mold 24 is also designed for ease of removal of the shaped preform, producing a preform having straight-sided or tapered elements without obstruction to removal of the preform from the mold. After release of the preform, the mold 24 may be reused, with the same or a different insert, to produce another preform by the same injection molding process.

Figure 14:
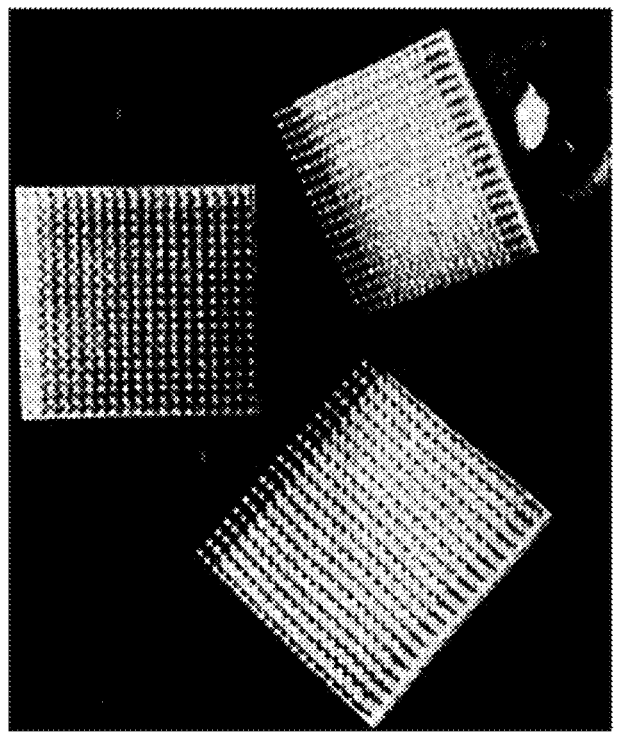
FIG. 14 is a photograph of 1-3 type preform that may be fabricated by an embodiment process.

An injection molded green body is illustrated in FIG. 14. The green body includes rod-shaped ceramic mixture elements disposed in a regular array on, and extending perpendicularly outward from, one planar surface of a supporting ceramic mixture base. The individual elements are separated from one another by void spaces. The distance between elements is the so-called "trench width." Extending outwardly from the opposing planar surface of the base is a stem, not shown in FIG. 14, conforming to the shape of the mold sprue. The stem typically is removed immediately after molding. The size and shape of each element, the trench width, and the design of the array of elements on the base in the injection molded green body may be determined empirically to allow for shrinkage during the binder material burnout (also referred to herein as "extraction") and densification steps to produce a sintered preform (ceramic body) having a geometry selected in accordance with known principles to produce the intended transducer characteristics.

Two sintered preforms are also shown in FIG. 14. Typical sintered preform cross-sectional shapes for rod-shaped elements include cylindrical, square, rectangular, triangular, and hexagonal, and the elements may be straight-sided or tapered. Typical sizes for the elements are diameters, or equivalent diameters, of about 20-200 μm and aspect ratios (length to diameter) of at least about 3:1 up to about 20:1. The trench width is typically 20-5000 μm. The thickness of the base is selected to provide rigid support for the element array during processing, and the base typically extends at each edge about one-half of the trench width beyond the outermost elements.

The green body may be heat treated at a temperature slightly above the decomposition temperature of the binder for a time sufficient to completely remove the binder. For a paraffin wax binder, for example, a typical burnout (binder material extraction) step involves a temperature of about 300°-700° C. and a time of about 10-100 hr. It is advantageous to successful preform fabrication that the binder burnout be nondestructive (i.e., that the removal of the binder be accomplished leaving no cracks or voids in the burned-out body that are large enough to cause failure in the sintered preform or to interfere with the operation of the transducer fabricated therefrom. As mentioned above, such nondestructive removal depends on such factors as selection of the binder and the parameters selected for the binder burnout heating step.

The binder-removed preform then may be densified to full density, i.e. at least about 95%, and preferably at least about 97%, of the theoretical density in a manner conventional for producing fully dense ceramics. (See, e.g., Newnham et al., supra, p. 98; Bast et al., supra, p. 2012; L. J. Bowen et al., Presentation, ISAF 92, 8th Int. Symposium on Appins. of Ferroelectrics, Clemson, SC, Sep. 1, 1992, Published March 1993; Bowen et al. is incorporated herein by reference.) A typical heating cycle suitable for sintering the preform includes sintering in a PbO-rich atmosphere at 1100°–1400° C. for 0.1-4 hr. Optionally, the preform may be further densified by hot isostatic pressing (HIPing) after sintering, for example at about 1100°–1400° C. and about 200-30,000 psi for about 0.1-4 hr. Conventional sinter-HIPing using similar parameters is also a suitable method for densifying the preform.

The fully dense preform including the array of elements supported by the integral base may then be encapsulated in known manner to create a rigid or flexible polymeric second phase matrix surrounding the elements and filling the void space therebetween. (See, e.g., Newnham et al., supra, p. 99; Hossack et al., supra, p. 621.) A typical encapsulation process involves pouring of a freshly compounded epoxy resin mixture, under vacuum, over the preform inverted in a mold slightly larger and deeper than the preform, allowing the epoxy resin to solidify, and removing the resulting composite structure from the mold. The composite is then machined to expose the element ends and, typically, to remove the supporting ceramic base of the preform. Such a 1-3 composite is shown in FIG. 15.

Figure 15:
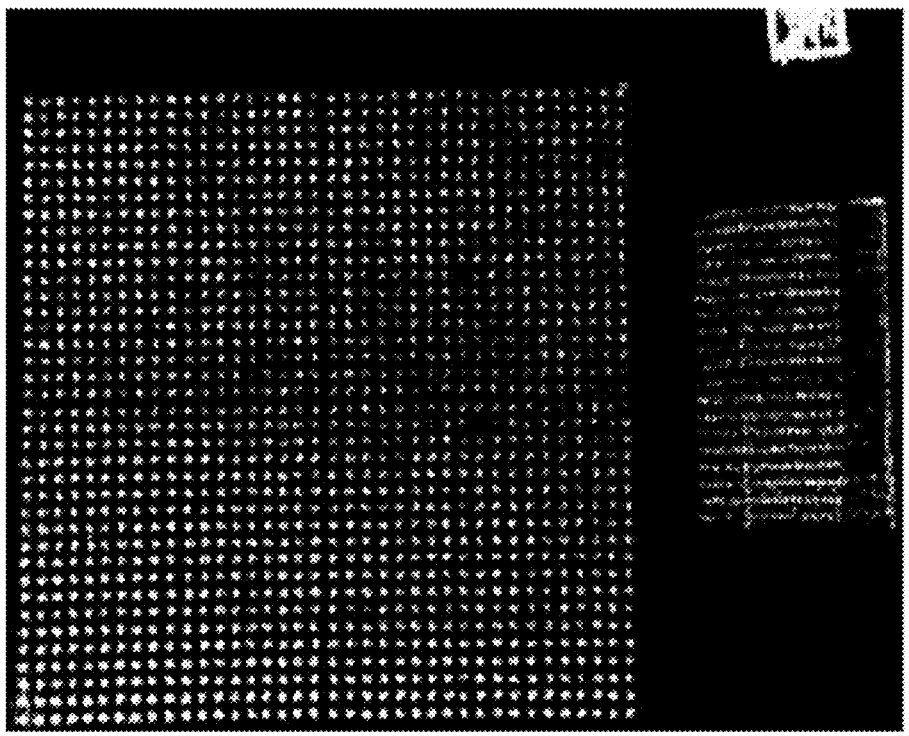
FIG. 15 is a photograph of a 1-3 composite preform that may be fabricated in accordance with yet another embodiment process.

The photograph of FIG. 15 illustrates the rod- or fiber-shaped piezoelectric elements from the preform embedded in parallel relation to one another in the polymeric matrix to form the 1-3 composite. The composite may then be electroded in known manner, for example by depositing a conventional electrode material, such as silver, gold, palladium, or an electrically conductive polymer, on the planar surfaces to establish electrical contact with the ceramic elements.

To render the device strongly piezoelectric, the elements may then be "poled" in known manner, i.e. a strong electric field may be applied to the elements at a temperature just below the Curie temperature, to create a polar axis. (See, e.g., Newnham et al., supra, p. 102.) Alternatively, the poling may be performed on the ceramic preform before encapsulation in the polymeric matrix and grinding off the base.

Figure 16:
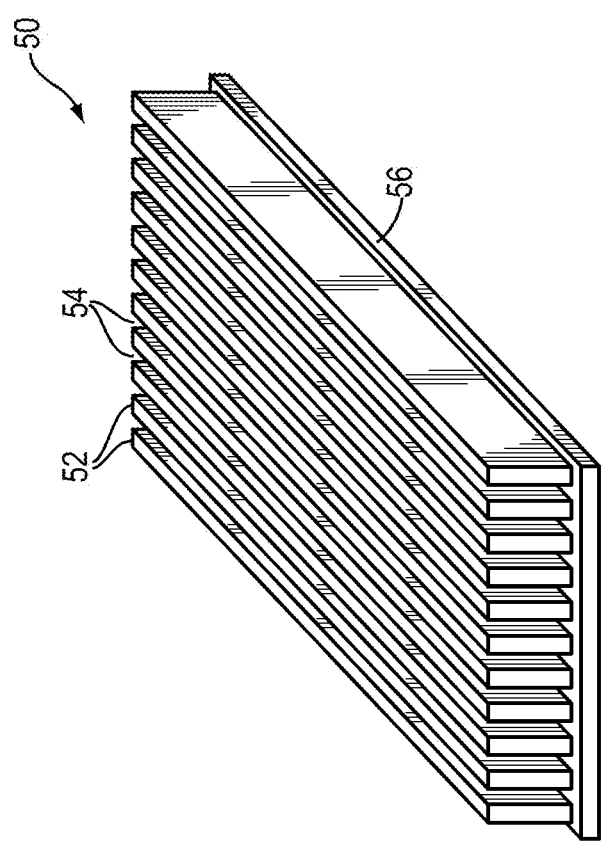
FIG. 16 is a schematic perspective view of a 2-2 type preform that may be fabricated in accordance with still another embodiment process.

Alternatively, preform mold 24 may be configured to produce a preform for a 2-2 composite. A typical ceramic preform for a 2-2 composite is illustrated schematically in FIG. 16, showing preform 50 including an array of parallel, planar ceramic elements 52 separated by parallel void spaces, or trenches, 54. Planar elements 52 are supported by planar ceramic base 56.

Figure 17:
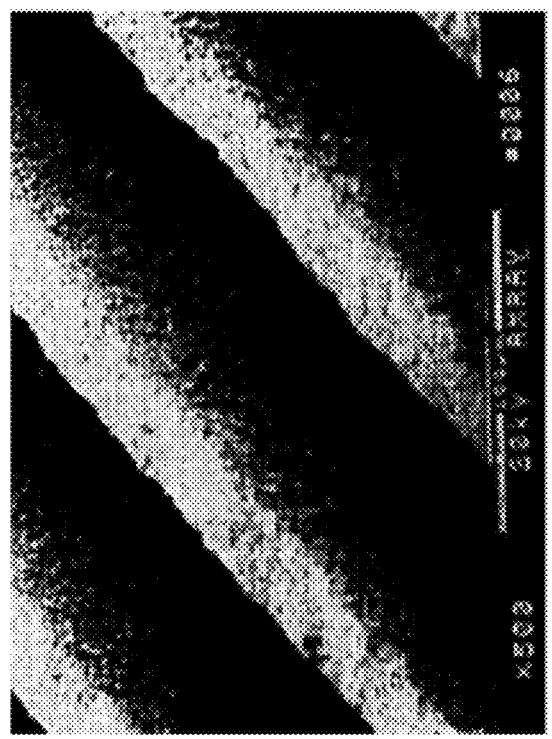
FIG. 17 is a photomicrograph of a fine-scale 2-2 composite preform that may be fabricated in accordance with the preform of FIG. 16.

FIG. 17 is a photomicrograph of a fine-scale 2-2 composite preform, which is suitable to be molded, sintered, and encapsulated with polymer as described above for the 1-3 composite. PZT/polymer lamellar 2-2 composites prepared by this process have been achieved exhibiting ceramic layers as thin as 30 μm. The 2-2 composite then may be machined to remove the ceramic base and to expose the outer planar surfaces of the outermost elements, and these outer surfaces may be electroded in a manner similar to that described above for the 1-3 composite. The composite may be poled in the manner described hereinabove.

The individual preforms described above are about 50×50 mm in element array size. However, larger arrays may be fabricated. In one method, the outer edges of the ceramic bases of several densified preforms may be machined, if necessary, to remove excess base material, and the bases placed adjacent to one another in a coplanar arrangement, for example by butting the adjacent edges together, to fill an encapsulation mold of the required size. In another method, the preforms are designed so that the tile together seamlessly without gaps. After encapsulation, the bases may be machined away, leaving the desired large array of encapsulated elements. The 1-3 composite illustrated in FIG. 15 was fabricated by this method using 4 ceramic preforms, each about 50×50 mm.

Although the ceramic material described hereinabove is lead zirconate titanate (PZT), such materials as lead magnesium niobate (PMN) and similar strongly piezoelectric or electrostrictive materials such as barium titanate, lead titanate, strontium titanate, bismuth titanate, and their derivatives are also suitable for fabrication by the injection molding method described herein. Suitable matrix materials depend on the application to which the fabricated device is directed and on their capability to provide an integral matrix using the above-described encapsulation process. Such materials include both rigid and flexible polymeric materials, for example, epoxy resins, polyurethanes, and elastomers.

EXAMPLE

The following example is presented to enable those skilled in the art to understand more clearly and to practice the disclosed embodiments. This example should not be considered as a limitation upon the scope of the present disclosure, but merely as being illustrative and representative thereof.

Piezoelectric composites consisting of parallel-oriented PZT fibers in a polymer matrix (1-3 configuration) were fabricated by injection molding using the process described. Rare earth donor-doped PZT powder (Morgan Matroc, Inc., Bedford, Ohio, designation PZT-5H) was mixed with paraffin wax in a heated mixer at a temperature above the melting point of the wax for sufficient time (approximately one to eight hours) to form a homogeneous mixture. After cooling, the mixture was granulated into small pieces and fed into an injection molding machine fitted with a mold. The mold contained a cavity having an open base approximately 50 mm square, which contained a replaceable tool including 361 fiber-shaped open cavities approximately 1 mm diameter and 10 mm long. The resulting assembly provided a cavity shaped as the negative of the preform to be molded. The injection molding process remelted the PZT-wax mixture, allowing the mixture to fill the cavity fully under pressure. Metal surfaces of the apparatus exposed to the hot PZT mixture were hard-faced to minimize contamination of the mixture.

Following the molding step, the PZT/wax preform was removed from the mold, the stem formed by the sprue was removed, and the preform was placed in an oven and heated slowly over a two-day period until the wax had burned away fully. The resulting porous PZT preform was then placed in a closed ceramic crucible and heated to a temperature in the range 1200° C. to 1300° C. until densification was completed, cooled down and removed as a dense ceramic preform.

To complete the composite fabrication procedure, preforms made in this manner were embedded in either epoxy resin or polyurethane polymer depending on application requirements. The final process steps were to grind away the ceramic base plate, apply metal electrodes to the ends of the exposed PZT elements, and pole the ceramic under high electric field of 20-25 kV/cm at about room temperature to about 110° C.

Using this technique, PZT ceramic preforms having both 1-3 and 2-2 geometry were fabricated with PZT element dimensions as small as 25 μm and as large as 1.5 mm wide. Piezoelectric and dielectric properties of injection molded PZT piezoelectric ceramic 1-3 composites are compared with those of the die pressed bulk material in the Table below. The comparable properties shown in the Table demonstrate that iron contamination of the molded mixture is minimal, and that excellent piezoelectric and dielectric properties are maintained using this process.

TABLE

| Specimen Type | Relative Permittivity | Dielectric Loss | d33 (pC/N) |
|---|---|---|---|
| Die-Pressed | 3584 | 0.018 | 745 |
| Injection Molded | 3588 | 0.018 | 755 |

The process described herein utilizes reusable tool inserts, which are easily interchanged for variation of preform design. The self-supporting preform green body is released from the tool before binder removal and sintering. Full density is readily achieved in the preform body by commercially viable sintering processes using existing sintering equipment. The process also offers many other advantages over alternative fabrication routes: complex, near net-shape capability for handling many fibers simultaneously; rapid throughput (typically minutes per part); flexibility with respect to transducer design (allows variation in PZT element spacing and shape); and lower cost in moderate volume production because the tooling used to form the part can be reused and its cost spread over many parts.

Figure 18:
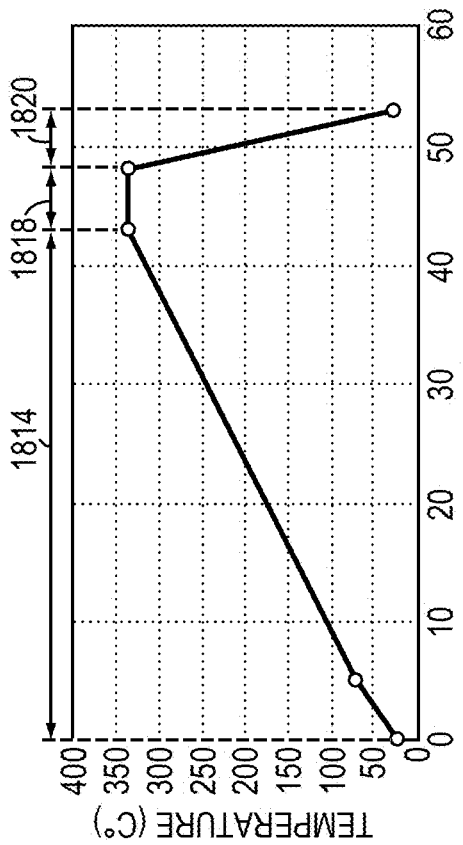
FIG. 18 is a graph showing a preliminary pre-firing temperature profile that may be used in embodiment processes.

FIG. 18 is a graph illustrating a preliminary pre-firing temperature profile that may be used in example embodiment processes. The graph shows temperature (° C.) as a function of time (arbitrary units). After a ramp up period 1814 from room temperature, temperature of the green body is held at around 335° C. during a preliminary pre-firing hold period 1818. After the hold period 1818, temperature of the green body is ramped down to room temperature once again during a ramp down period 1820.

Figure 19:
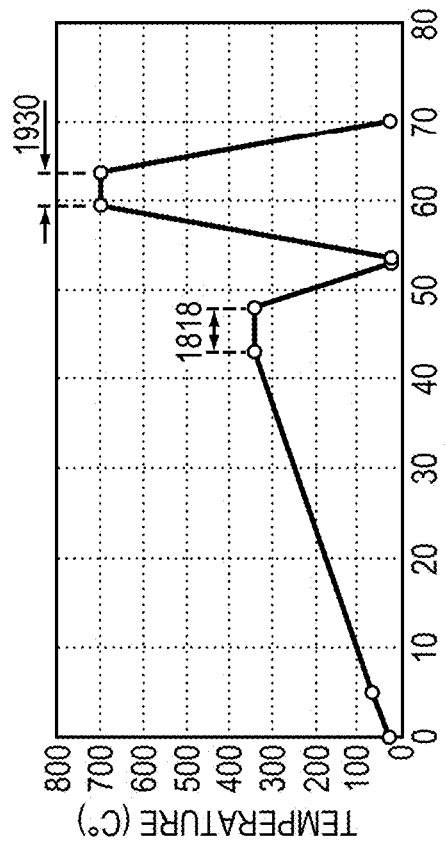
FIG. 19 is a graph showing the preliminary pre-firing temperature profile of FIG. 18, followed by a final pre-firing temperature profile as an example that may be used as a part of certain embodiment processes.

FIG. 19 is a graph showing a temperature profile that may form part of a temperature part of a pre-firing stage in embodiment processes for preparing a porous ceramic body. In FIG. 19, the preliminary pre-firing hold period 1818 is illustrated, and following the ramp down period 1820 shown in FIG. 18, temperature of the green body is ramped up to about 700° C. for a final pre-firing process, where the final pre-firing temperature is held for a final pre-firing hold period 1930. Afterward, the temperature is ramped back down to room temperature.

Figure 20:
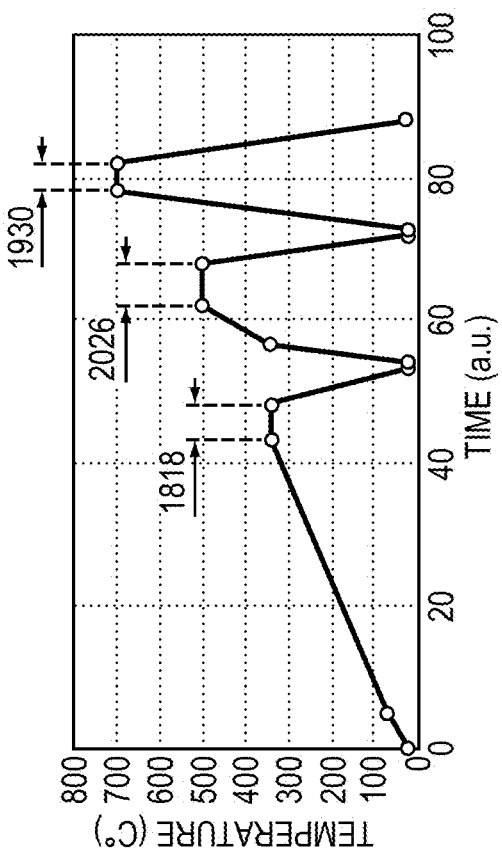
FIG. 20 is a graph showing a temperature profile that includes a combination of preliminary, intermediate, and final pre-firing temperature periods that may be used in an embodiment process, wherein the pre-firing periods are separated from each other by temperature decreases to room temperature.

FIG. 20 is a graph showing all three pre-firing periods that may be used in embodiment processes for preparing a porous ceramic body for an acoustic transducer. Following the preliminary pre-firing temperature profile illustrated in FIG. 18, the temperature is ramped up from room temperature to an intermediate pre-firing temperature, in this case about 500° C., and held for an intermediate pre-firing hold period 2026. After the hold period 2026, temperature is ramped down again to room temperature. Following this ramp down, the temperature is once again ramped up, this time to the final pre-firing temperature of about 700° C., held at the final pre-firing temperature for the final pre-firing hold period 1930, and then ramped back down to room temperature, all preparatory to a sintering (firing) process.

The various pre-firing periods need not be separated by ramps down in temperature between them. Advantageously, in some embodiments, a green body may be pre-fired according to all pre-firing periods described herein in the same oven. Accordingly, there need not be ramps back down to room temperature, or to any other temperature, between successive pre-firing periods.

Figure 21:
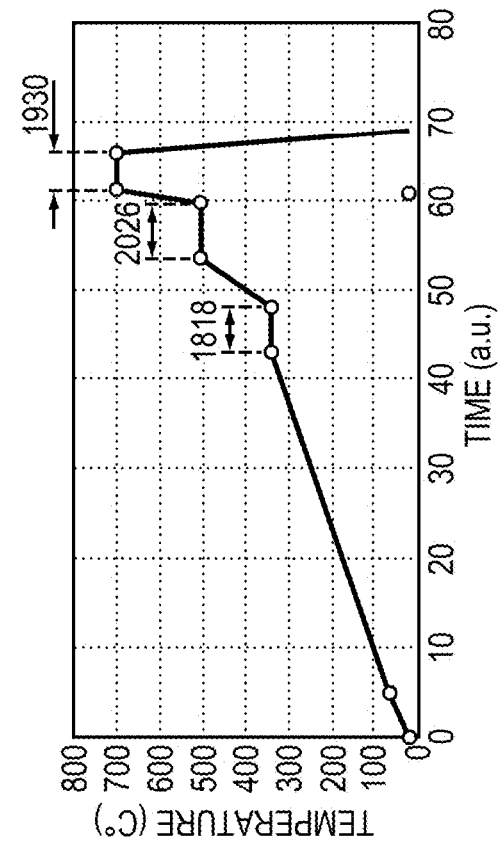
FIG. 21 is a graph showing eight temperature profile that may be used in embodiments, in which temperature is increased from the preliminary pre-firing period, to the intermediate pre-firing period, to the final pre-firing period without intervening decreases in temperature.

FIG. 21 is a graph exemplifying this option, showing a temperature curve for preliminary, intermediate, and final pre-firing periods for a green body, each of these pre-firing periods being carried out in the same oven, without decreasing temperature between the pre-firing periods. In FIG. 21, after the temperature is ramped up to the preliminary pre-firing temperature and held at that temperature for the preliminary pre-firing hold period 1818, the temperature is ramped up directly to the intermediate pre-firing temperature, about 500° C., and held for the intermediate pre-firing hold period 2026. After the hold period 2026, temperature of the oven environment in which the green body is held is directly ramped up to the final pre-firing temperature, about 700° C. and held for the final pre-firing hold period 1930. In this manner, embodiment processes may be further facilitated.

Figure 22:
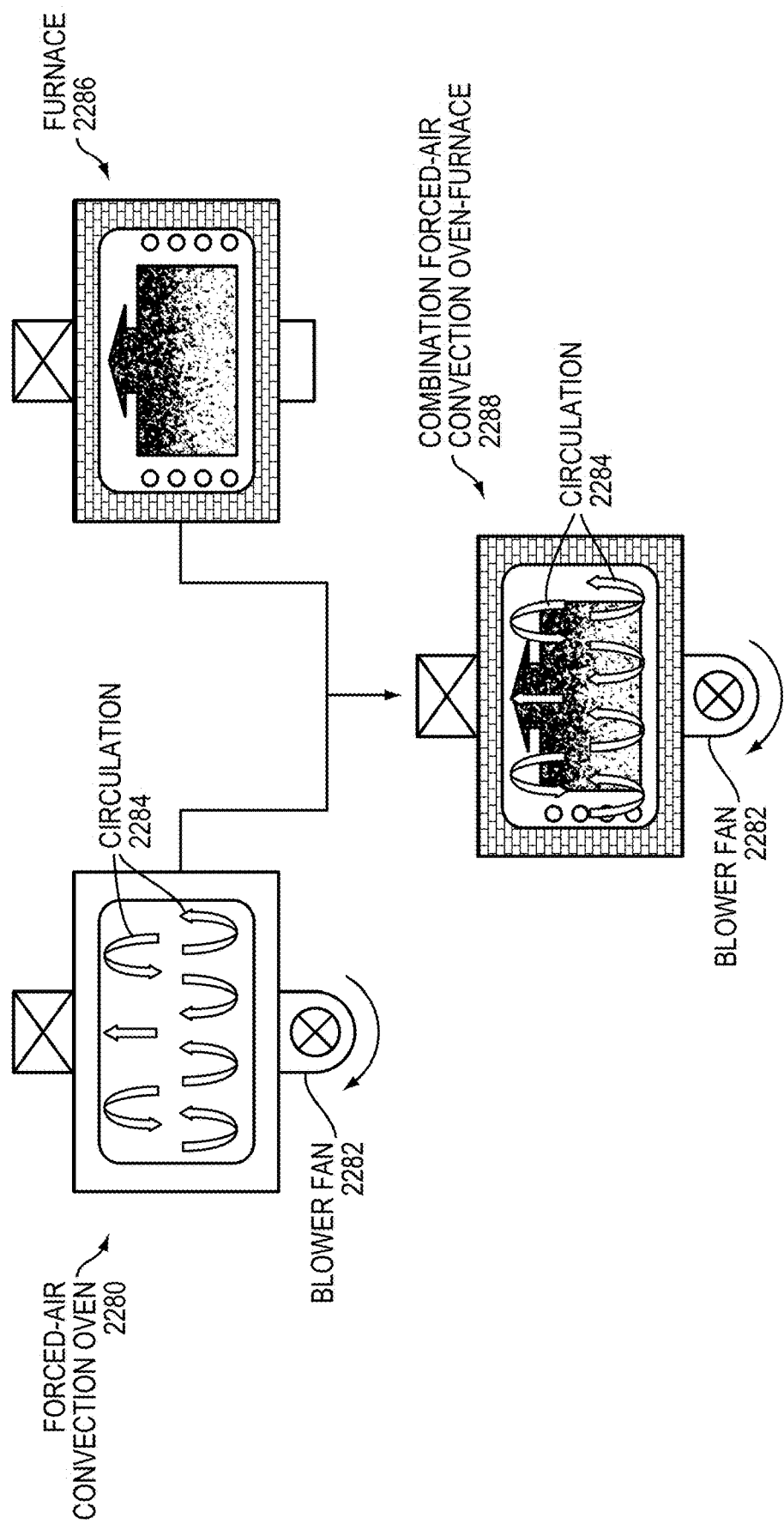
FIG. 22 is a schematic illustration of a combination forced-air convection oven-furnace that may be advantageously employed in embodiment processes.

FIG. 22 is a schematic diagram illustrating a combination forced-air convection oven-furnace 2288 that may be advantageously employed in embodiment processes. In particular, extracting the binder material, decomposing the pore forming particles, removing residual organic materials, and sintering the green body may all be performed in the same combination oven-furnace 2288, thus greatly facilitating performance of embodiment processes described herein. FIG. 22 particularly shows an existing forced-air convection oven 2280, in which a blower fan 2282 causes circulation 2284 within the oven. As described hereinabove, air circulation can be advantageously employed to promote decomposition of the pore-forming particles and removal of the resulting water and carbon dioxide from the green body matrix by circulation of fresh air through the oven, for example. FIG. 22 also illustrates an existing furnace 2286 that can be used to heat a green body for sintering for the sintering stage of forming a porous ceramic body, for example.

When the functions of the forced-air convection oven 2280 and of the furnace 2286 are combined in the combination forced-air convection oven-furnace 2288, in part by including the blower fan 2282 and the circulation 2284 caused thereby, pre-firing processes and sintering may be performed in the same oven-furnace. This can minimize or eliminate cooling stages and other intermediate steps during an embodiment process, from a stage where a green body is formed by injection molding, for example, through the sintering process. In this manner, the temperature profile illustrated in FIG. 21 may be extended, such that there is no cooling period between the final pre-firing hold period 1930 and a sintering stage, which is not illustrated in FIG. 21 but is illustrated in FIGS. 4-5, for example.

While there have been shown and described what are at present considered the preferred embodiments of the invention, it will be obvious to those skilled in the art that various changes and modifications can be made therein without departing from the scope of the invention as defined by the appended claims.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A process for preparing a porous ceramic body, the process comprising:
    forming a green body comprising a mixture of a ceramic material powder, a binder material, and pore-forming particles;
    extracting the binder material from the green body by heating the green body at a preliminary pre-firing temperature;
    decomposing the pore-forming particles by heating the green body at an intermediate pre-firing temperature that is higher than the preliminary pre-firing temperature;
    after decomposing the pore-forming particles, removing residual organic materials from the green body by heating the green body at a final pre-firing temperature that is higher than the intermediate pre-firing temperature; and
    sintering the green body at a sintering temperature that is higher than the final pre-firing temperature to form the porous ceramic body.

2. The process of claim 1, wherein forming the green body includes injection molding the mixture.

3. The process of claim 2, wherein injection molding is to net shape.

4. The process of claim 1, wherein the porous ceramic body is a piezoelectric composite body.

5. The process of claim 1, wherein the ceramic material powder is a PZT powder.

6. The process of claim 1, wherein the binder material is a wax.

7. The process of claim 1, wherein the pore-forming particles are PMMA particles.

8. The process of claim 1, wherein the pore-forming particles have an average diameter between 5 μm and 15 μm.

9. The process of claim 1, wherein the preliminary pre-firing temperature is between 290° C. and 390° C.

10. The process of claim 1, wherein the preliminary pre-firing temperature is between 310° C. and 370° C.

11. The process of claim 1, wherein the intermediate pre-firing temperature is between 450° C. and 550° C.

12. The process of claim 1, wherein the intermediate pre-firing temperature is between 475° C. and 525° C.

13. The process of claim 1, wherein the final pre-firing temperature is between 600° C. and 800° C.

14. The process of claim 1, wherein the final pre-firing temperature is between 675° C. and 725° C.

15. The process of claim 1, wherein the sintering temperature is between 1025° C. and 1485° C.

16. The process of claim 1, wherein the sintering temperature is between 1225° C. and 1285° C.

17. The process of claim 1, further including sealing the green body in a Pb atmosphere after the final pre-firing and before the sintering.

18. The process of claim 1, wherein at least one of extracting the binder material, decomposing the pore-forming particles, and removing the residual organic materials includes immersing the green body in a stabilized zirconia or Zircon ($ZrSiO_4$) sand bath.

19. The process of claim 1, wherein sintering the green body includes placing the green body on an $Al_2O_3$ setter.

20. A process for preparing a piezoelectric or electrostrictive acoustic transducer, the process comprising:
    preparing the porous ceramic body according to the process of claim 1; and
    electroding the sintered, porous ceramic body at opposing surfaces of the sintered, porous ceramic body to form a piezoelectric or electrostrictive acoustic transducer.

21. The process of claim 20, wherein forming the green body includes injection molding the mixture.

22. The process of claim 21, wherein the injection molding is to net shape.

23. The process of claim 20, wherein electroding is performed with the opposing surfaces of the sintered, porous ceramic body being substantially non-porous.

24. The process of claim 20, further comprising attaching at least one backing layer or matching layer to the acoustic transducer.

25. The process of claim 20, further comprising encapsulating the acoustic transducer in a polymeric material.

26. The process of claim 20, wherein the sintered, porous ceramic body is a piezoelectric ceramic body, the process further comprising poling the sintered, porous ceramic body by applying an electric field.

27. The process of claim 20, wherein the electroding results in the piezoelectric or electrostrictive acoustic transducer exhibiting a 1-3 or 2-2 piezocomposite connectivity.

28. A process for preparing a porous ceramic body, the process comprising:
   decomposing pore-forming particles from a green body by heating the green body at an intermediate pre-firing temperature, the green body having been formed by injection molding a mixture of a ceramic material powder, a binder material, and pore-forming particles, and the binder material having been substantially extracted from the injection molded green body by heating the green body at a preliminary pre-firing temperature that is lower than the intermediate pre-firing temperature prior to decomposing the pore-forming particles;
   removing residual organic materials from the green body, after decomposing, by heating the green body at a final pre-firing temperature that is higher than the intermediate pre-firing temperature; and
   sintering the green body to form the porous ceramic body, wherein sintering the green body follows decomposing the pore-forming particles from the green body and removing residual organic materials from the green body.

29. The process of claim 28, wherein sintering is performed by heating the green body at a sintering temperature that is higher than the intermediate pre-firing temperature and the final pre-firing temperature.

30. The method of claim 1 wherein heating the green body at the intermediate pre-firing temperature includes maintaining the intermediate pre-firing temperature within a tolerance thereof for an intermediate pre-firing hold period.

31. The method of claim 1 wherein heating the green body at the final pre-firing temperature includes maintaining the final pre-firing temperature within a tolerance thereof for a final pre-firing hold period.

* * * * *